US011362058B2

(12) United States Patent
Huybers et al.

(10) Patent No.: US 11,362,058 B2
(45) Date of Patent: Jun. 14, 2022

(54) BONDING AND INDEXING APPARATUS

(71) Applicant: NEXPERIA B.V., Nijmegen (NL)

(72) Inventors: Ralph Huybers, Nijmegen (NL); Hans Van De Rijdt, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 839 days.

(21) Appl. No.: 16/233,408

(22) Filed: Dec. 27, 2018

(65) Prior Publication Data
US 2019/0206829 A1   Jul. 4, 2019

(30) Foreign Application Priority Data

Dec. 28, 2017 (EP) .................................... 17210923

(51) Int. Cl.
| G11C 16/04 | (2006.01) |
| H01L 23/00 | (2006.01) |
| H01L 21/683 | (2006.01) |
| B23K 20/02 | (2006.01) |
| H01L 21/68 | (2006.01) |

(52) U.S. Cl.
CPC ............ *H01L 24/79* (2013.01); *B23K 20/025* (2013.01); *H01L 21/68* (2013.01); *H01L 21/6835* (2013.01); *H01L 21/6836* (2013.01); *H01L 24/50* (2013.01); *H01L 24/75* (2013.01); *H01L 2221/68313* (2013.01); *H01L 2224/7565* (2013.01); *H01L 2224/75252* (2013.01); *H01L 2224/75301* (2013.01); *H01L 2224/75343* (2013.01); *H01L 2224/86203* (2013.01)

(58) Field of Classification Search
CPC ..... H01L 24/79; H01L 21/68; H01L 21/6835; H01L 21/6836; H01L 24/50
See application file for complete search history.

(56) References Cited

U.S. PATENT DOCUMENTS

| 8,368,995 B2 * | 2/2013 | Dallesasse | H01S 5/141 |
| | | | 359/279 |
| 10,199,350 B2 * | 2/2019 | Wan | H01L 24/75 |
| 2002/0106603 A1 * | 8/2002 | L. Foong | H01L 21/67144 |
| | | | 432/253 |
| 2010/0075459 A1 | 3/2010 | Kerr et al. | |
| 2021/0242044 A1 * | 8/2021 | Mitsuishi | H01L 21/02 |

OTHER PUBLICATIONS

European Search Report and Written Opinion for corresponding European application EP17210923.3, dated Jun. 26, 2018, 8 pages.

* cited by examiner

*Primary Examiner* — Pho M Luu
(74) *Attorney, Agent, or Firm* — Ohlandt, Greeley, Ruggiero & Perle, LLP

(57) ABSTRACT

A bonding and indexing apparatus has a first index head to move a substrate in an indexing direction from a first position to a second position and a second index head to move the substrate in an indexing direction from the second position to a third position. The first and/or second index head has a bonding element to effect a bonding process between the substrate and an element disposed against the substrate so that bonding and movement in the indexing direction is implemented simultaneously by the first index head and/or bonding and movement in the indexing direction is implemented simultaneously by the second index head.

20 Claims, 27 Drawing Sheets

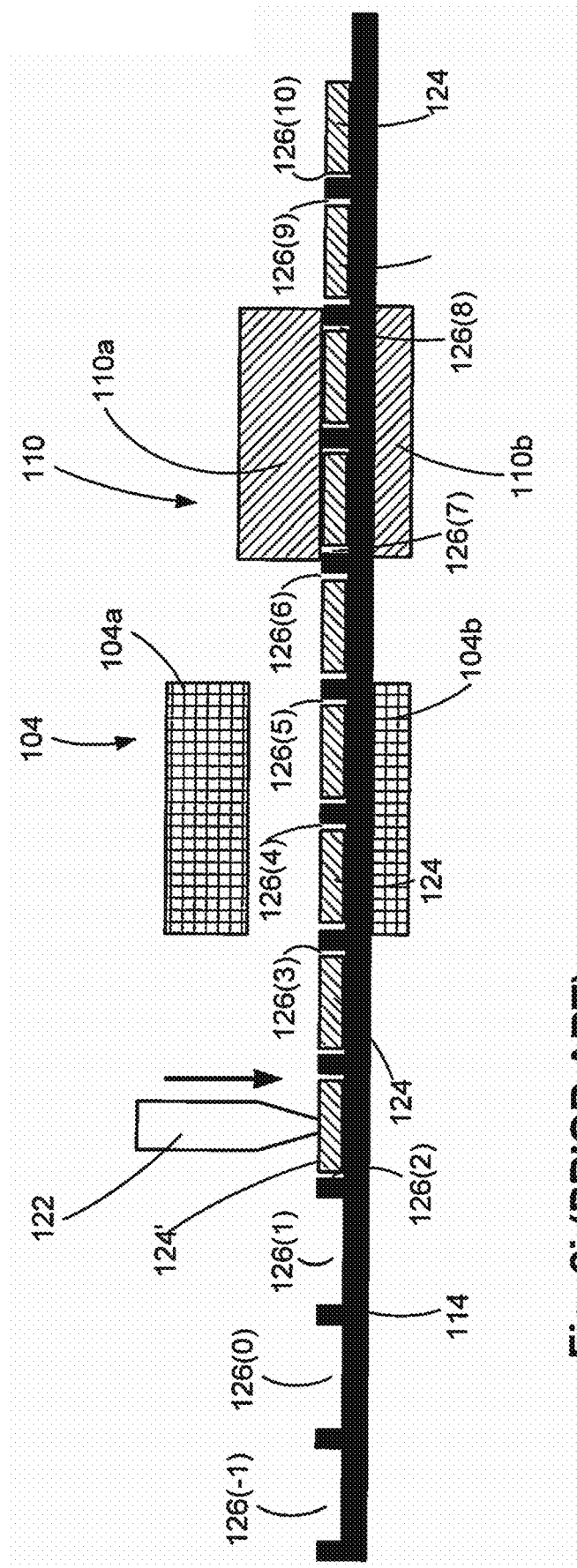

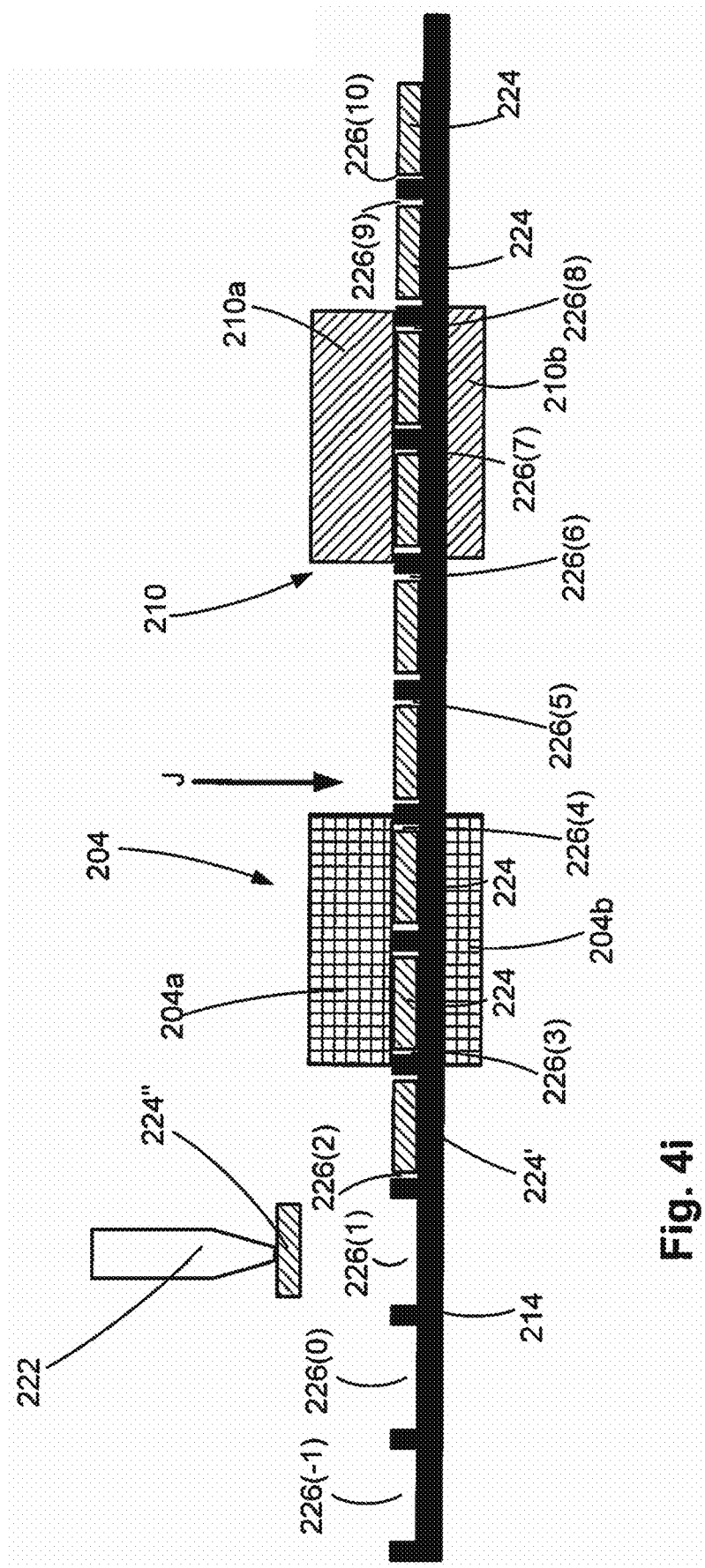

BONDING AND INDEXING APPARATUS

CROSS REFERENCE TO RELATED APPLICATIONS

This application claims benefit under 35 U.S.C. § 119(a) of European Patent Application No. EP17210923.3 filed Dec. 28, 2017, the entire contents of which are incorporated herein by reference.

BACKGROUND OF THE DISCLOSURE

1. Field of the Disclosure

The invention relates to a bonding and indexing apparatus. In particular, but not exclusively, the present invention relates to a thermocompression and indexing apparatus, which may, further particularly, be employed in a packaging system operative to populate transport tapes with electronic components.

2. Description of Related Art

In semiconductor production, processes can involve moving (hereinafter "indexing") a substrate and performing a process step where a bonding step takes place, e.g. bonding a cover tape to a carrier tape in a transport tape. In some arrangements compressive force is applied to the substrate at a defined temperature, such as, for example, in thermocompression bonding. The substrate is indexed over a specific distance, or pitch, during each indexing cycle. After each indexing step, thermocompression takes place. The indexing and thermocompression steps are conducted in an alternating sequence. That is, a thermocompression shoe, or head, is operative to move toward the substrate to press an element (e.g. cover tape) disposed on the substrate against the substrate. Heat is applied to the element and to the substrate by the thermocompression head. Following the thermocompression step, the thermocompression head is operative to move away from the element and the substrate. When the thermocompression head has moved to a retracted position, an indexing shoe, or head, is operative to move toward the substrate and to grip the substrate. The indexing head then indexes the substrate in an indexing direction to move the substrate from a first position to a second position. After completion of the movement in the indexing direction, the indexing head releases the substrate and moves to a retracted position and returns to a start position. The cycle is then repeated.

A known thermocompression and indexing apparatus 100 is illustrated in FIG. 1 and a known thermocompression and indexing process cycle implemented by the apparatus of FIG. 1 is illustrated schematically in FIGS. 2a to 2o. These are described in general overview below.

The thermocompression and indexing apparatus 100 includes a thermocompression unit 102, which comprises a thermocompression head 104 and thermocompression head control circuitry and actuators 106. The thermocompression and indexing apparatus 100 also includes an indexing unit 108, which comprises an indexing head 110 and indexing head control circuitry and actuators 112.

Each of the thermocompression head 104 and the indexing head 110 comprise a pair of sections (i.e. an upper section and a lower section (not shown)). The upper section of each head is located above a substrate feed channel and the lower section of each head is located below the substrate feed channel. The upper section of each head is moveable towards and away from the lower section of each head in a vertical direction (i.e. along a Z-axis as indicated in the figure). This serves to clamp, or grip, a substrate located in the substrate feed channel between the upper and lower sections of each head.

Movement of the thermocompression head 104 and the indexing head 110 relative to the substrate feed channel is controlled by way of the thermocompression head control circuitry and actuators 106 and the indexing head control circuitry and actuators 112 respectively.

A substrate 114 is fed into the substrate feed channel of the apparatus 100 in the direction indicated by arrow A (i.e. in a positive direction along the X-axis). As the substrate 114 is fed through the apparatus along the X-axis, elements can be placed on the substrate 114 at a first insertion or depositing point (indicated by arrow 116 in the figure) by a suitable element insertion or depositing device. Additional elements or material may be fed into the apparatus 100 for placement on, or against, the substrate 114 via a second insertion or depositing point (indicated by arrow 118 in the figure).

With all elements and/or materials placed on, in, and/or against, the substrate 114, the substrate 114 then passes between the upper and lower sections of thermocompression head 104. Thermocompression head 104 is operative to perform thermocompression bonding, to the substrate, of the elements and/or materials fed into the apparatus. It achieves this by moving the upper section downwards to press the elements and/or materials against the substrate, which is pressed against the lower section. Heat is applied to the elements and/or materials and the substrate 114 to bond the elements and/or materials to a section of the substrate located between the upper and lower sections of the thermocompression head 104.

Following thermocompression bonding of the elements and/or materials to a section of the substrate in this manner, the upper section of the thermocompression head 104 returns to a start position. The upper section of the indexing head 110 then moves downwards to press a "bonded" section of the substrate 114 (that was bonded during a previous processing step) against the lower section. The indexing head 110 then proceeds to advance (i.e. index) the substrate 114 in the positive direction along the X-axis. This indexes the substrate 114 in the substrate feed channel so that a section that was bonded during the previous thermocompression step is moved forwards and away from a location between the upper and lower sections of the thermocompression head 104. This causes an unbonded section of the substrate 114 to be pulled into the location between the upper and lower sections of the thermocompression head 104, to be bonded during the next cycle.

In addition to moving an unbonded section of the substrate 114 into a bonding region of the substrate feed channel, i.e. between the upper and lower sections of the thermocompression head 104, the process of advancing the substrate also moves a new section of the substrate 114 into the "feed" end of the substrate feed channel. As before, elements and/or materials can then be added to this new section of the substrate 114.

Processed substrate 120 is output from the apparatus 100 at a downstream end thereof.

The thermocompression head 104 (particularly, the upper section of the thermocompression head 104) has freedom of movement in only one direction, i.e. along the Z-axis (denoted by arrow Zt in FIG. 1). However, the indexing head 110 (particularly, the upper section of the indexing head 110) has freedom of movement in two directions, i.e. along the Z-axis (to grip the substrate), denoted by arrow Zi in the figure and along the X-axis (to advance the substrate in the substrate feed channel), denoted by arrow Xi in the figure.

Use of the apparatus 100 to implement a thermocompression and indexing process cycle will now be described with reference to FIGS. 2a to 2o. The use will be described by way of example in relation to a known process for the population of a transport tape with, for example, electronic components.

Transport tapes may be used for the purpose of transport and delivery of electronic components to an automatic placement machine. The electronic components are enclosed in the transport tape, which can be stored and transported in a rolled-up state. The transport tape comprises a first strip (known as a carrier tape), which comprises preformed tape pockets in which electronic components can be disposed. The tape pockets of the carrier tape are covered with a second strip (known as a cover tape) to retain the electronic components in the tape pockets. The cover tape is bonded to the carrier tape.

In FIGS. 2a to 2o, pertinent features of the apparatus 100 are shown for clarity purposes, namely; the thermocompression head 104 and the indexing head 110. Also shown is an element pick-up device 122, in particular an electronic component pick-up device. There is also shown a substrate 114, which comprises a carrier tape. The element pick-up device 122, for example a vacuum pipette, is used to pick-up electronic components 124 from a storage location and move them to a position above the substrate 114 (hereinafter carrier tape 114) from where the electronic components can be placed in tape pockets 126(0) to 126(10) of carrier tape 114.

For convenience and clarity purposes a cover tape portion of the transport tape is not shown in FIGS. 2a to 2o.

As can be seen, the carrier tape 114 is shown in a partially populated state in FIG. 2a. That is, tape pockets 126(3) to 126(10) already contain electronic components 124, while tape pockets 126(0), 126(1) and 126(2) are empty.

The thermocompression head 104 comprises an upper section 104a and a lower section 104b. The indexing head 110 comprises an upper section 110a and a lower section 110b. The heads and their respective upper and lower sections have been described above in relation to FIG. 1.

In FIG. 2a, the upper sections 104a and 110a of both respective heads 104 and 110 are in a raised, or start, position.

From the position illustrated in FIG. 2a, the upper section 104a of head 104 moves downwards (see FIG. 2b) from the start position to a lowered position illustrated in FIG. 2c. In the lowered position, the upper section 104a presses the cover tape (not shown) against a portion of the carrier tape 114 located in a bonding region of the substrate feed channel. The portion of the carrier tape 114 is pressed against lower section 104b of head 104. With the upper section 104a in the lowered position, the head 104 is actuated to apply heat to the portion of the cover tape and carrier tape 114 located in the bonding section (i.e. between the upper and lower sections of the head 104). By way of thermocompression, i.e. the application of pressure and heat, the portions of cover tape and carrier tape 114 between the upper and lower sections of head 104 are bonded together to sealably contain the electronic components 124 in the tape pockets 126(5) and 126(6). Those electronic components 124 in tape pockets 126(7) to 126(10) were sealably contained between bonded sections of cover tape and carrier tape 114 during earlier steps in the process cycle.

Following bonding of the portions of cover tape and carrier tape about tape pockets 126(5) and 126(6), the upper section 104a of head 104 is moved upward to return it to the start position (see FIG. 2d). Also, the upper section 110a of indexing head 110 is moved downwards from its start position to a lowered position. In the lowered position (see FIG. 2e), the upper section 110a presses a portion of cover tape and carrier tape 114 (previously bonded about tape pockets 126(7) and 126(8)) against lower section 110b.

From the position illustrated in FIG. 2e, indexing head 110 is moved in a direction indicated by arrow B (see FIG. 2f), i.e. corresponding to movement in a positive direction along the X-axis of FIG. 1. As a consequence of this, the carrier tape 114 and cover tape are also indexed in the same direction. The carrier tape 114 and cover tape are advanced by one tape pocket pitch, i.e. so that each tape pocket is indexed (to the right of the page in the figure) by one tape pocket pitch. Therefore, a new tape pocket (tape pocket 126(−1)) enters the substrate feed channel from the substrate input feed (see FIG. 2g).

With the indexing unit 110 still located in its advanced, lowered position, the element pick-up device 122 brings a new electronic component 124' to a location above empty tape pocket 126(2) of the carrier tape 114 (see FIG. 2g). From the position illustrated in FIG. 2g, the element pick-up device 122 is lowered to lower electronic component 124' towards empty tape pocket 126(2) (see FIGS. 2h and 2i) until the electronic component 124' is located in tape pocket 126(2) (see FIG. 2j). The element pick-up device 122 then releases the electronic component 124' so that the electronic component 124' remains in tape pocket 126(2). The element pick-up device is raised to a start position (see FIG. 2k).

When the element pick-up device 122 has reached the start position, the indexing head 110 is actuated to initiate raising of the upper section 110a from the lowered position (see FIG. 2l) to a raised position (see FIG. 2m). With the upper section 110a of indexing head 110 in the advanced raised position illustrated in FIG. 2m, the indexing head 110 is moved in a direction indicated by arrow C in FIG. 2n (i.e. in a negative direction along the X-axis). This reverse movement of indexing head 110 returns it to a start position (see FIG. 2o) from which point the next process cycle can begin.

Although the known thermocompression and indexing apparatus has been described in relation to an apparatus that comprises grippers for performing indexing steps, other known apparatuses comprise a pin, or pins, that are moveable and that are used to perform indexing. In other known apparatuses, indexing may be performed by a so-called sprocket-wheel. Regardless of the type of indexing element, in known thermocompression and indexing apparatus, thermocompression and indexing steps are performed in sequence, i.e. on after another.

Conducting each part of the process-cycle sequentially (i.e. the thermocompression step followed by the indexing step, or vice versa) may limit the output of a thermocompression and indexing apparatus implementing such a process.

Apparatus output may be increased by reducing the time of each part of the process. However, reducing time for the thermocompression part of the cycle by too much may affect quality of the product output by the apparatus.

Whilst the process and apparatus for implementing such a process, as described above, have been satisfactory and may continue to be satisfactory for certain operating conditions, the inventors have recognised that it would be desirable to increase the output speed of apparatus implementing such processes without adversely affecting the quality of products output by the apparatus.

One or more embodiments of the present invention have been devised with the foregoing considerations in mind.

SUMMARY

According to an aspect of the invention there is provided a bonding and indexing apparatus, comprising: a first index head operative to move a substrate in an indexing direction from a first position to a second position; a second index head operative to move the substrate in an indexing direction from the second position to a third position; wherein at least one of the first index head and the second index head comprises a bonding element operative to effect a bonding process between the substrate and an element disposed against the substrate such that bonding and movement in the indexing direction is implemented simultaneously by the first index head and/or bonding and movement in the indexing direction is implemented simultaneously by the second index head.

Thus, when indexing of the substrate begins by one of the heads, bonding is conducted at the same time by the same head, i.e. simultaneously. By conducting bonding at the same time as conducting indexing of the substrate, apparatus cycle time may be reduced and, as a consequence, the machine output may be increased.

Optionally, the first index head may be operative to move from a first index start position to engage with the substrate.

Optionally, the first index head may be operative to maintain engagement with the substrate during movement in the indexing direction.

Optionally, the first index head may be further operative to release the substrate from engagement upon reaching the second position.

Optionally, the first index head may be further operative to return to the first index start position upon reaching the second position.

Optionally, the second index head may be operative to move from a second index start position to engage with the substrate.

Optionally, the second index head may be operative to maintain engagement with the substrate during movement in the indexing direction.

Optionally, the second index head may be further operative to release the substrate from engagement upon reaching the third position.

Optionally, the second index head may be further operative to return to the second index start position upon reaching the third position.

Optionally, the bonding element may comprise a thermocompression element operative to apply a thermocompressive force to the substrate and to an element disposed against the substrate such that thermocompression and movement in the indexing direction is implemented simultaneously by the first index head and/or thermocompression and movement in the indexing direction is implemented simultaneously by the second index head.

Optionally, the first index head and/or the second index head may comprise a linear moving mechanism to effect movement of the substrate.

Optionally, the first index head and/or the second index head may comprise a rotary moving mechanism to effect movement of the substrate.

Optionally, the first index head and/or the second index head may be operative to grip the substrate during indexing movement.

BRIEF DESCRIPTION OF THE DRAWINGS

One or more specific embodiments in accordance with aspects of the present invention will be described, by way of example only, and with reference to the following drawings in which:

FIGS. 4a to 4j schematically illustrate a bonding and indexing process cycle implemented by the apparatus of FIG. 3.

DETAILED DESCRIPTION

Figure 1:
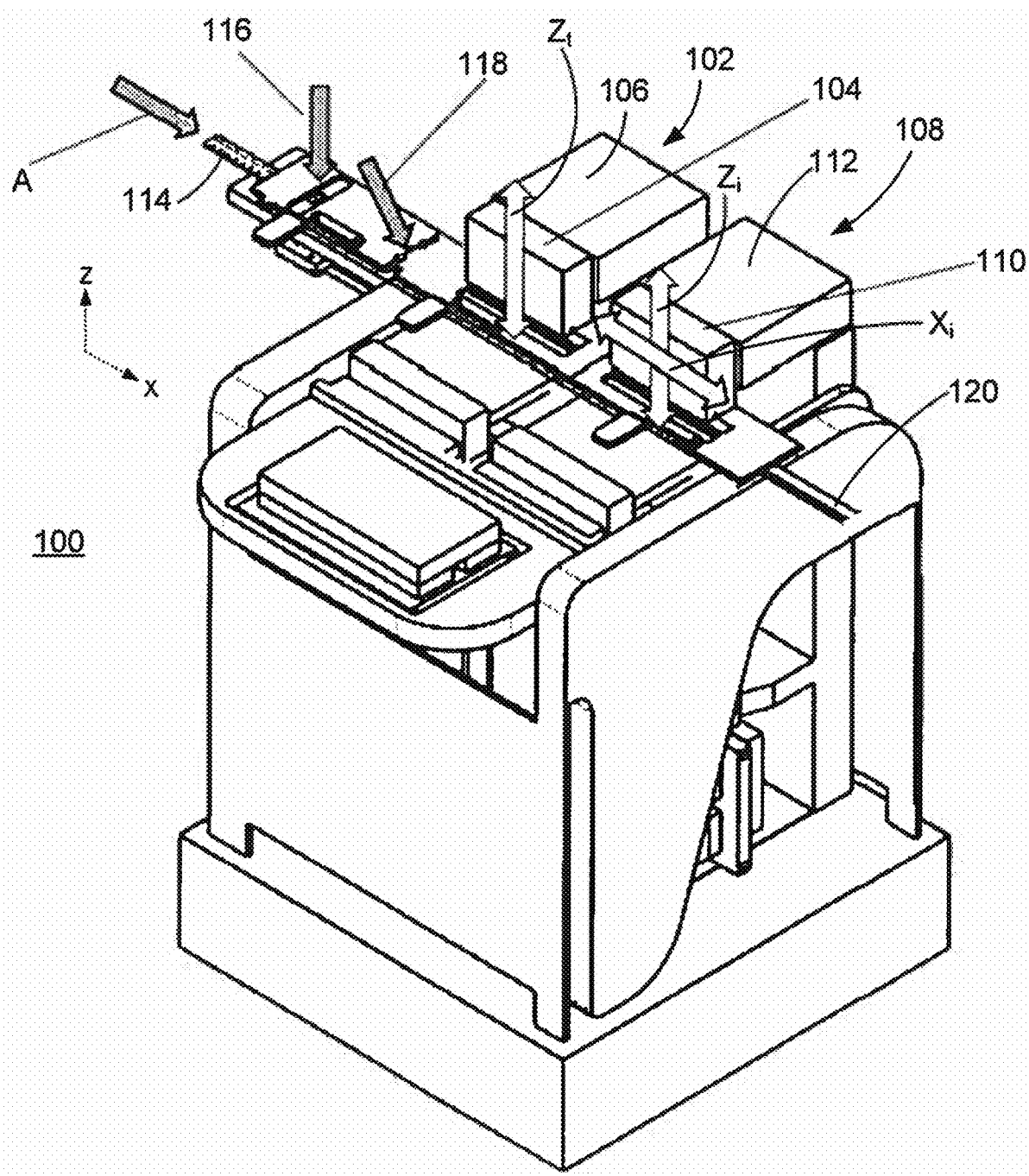
FIG. 1 illustrates a perspective view of a known thermocompression and indexing apparatus.
Figure 2A:
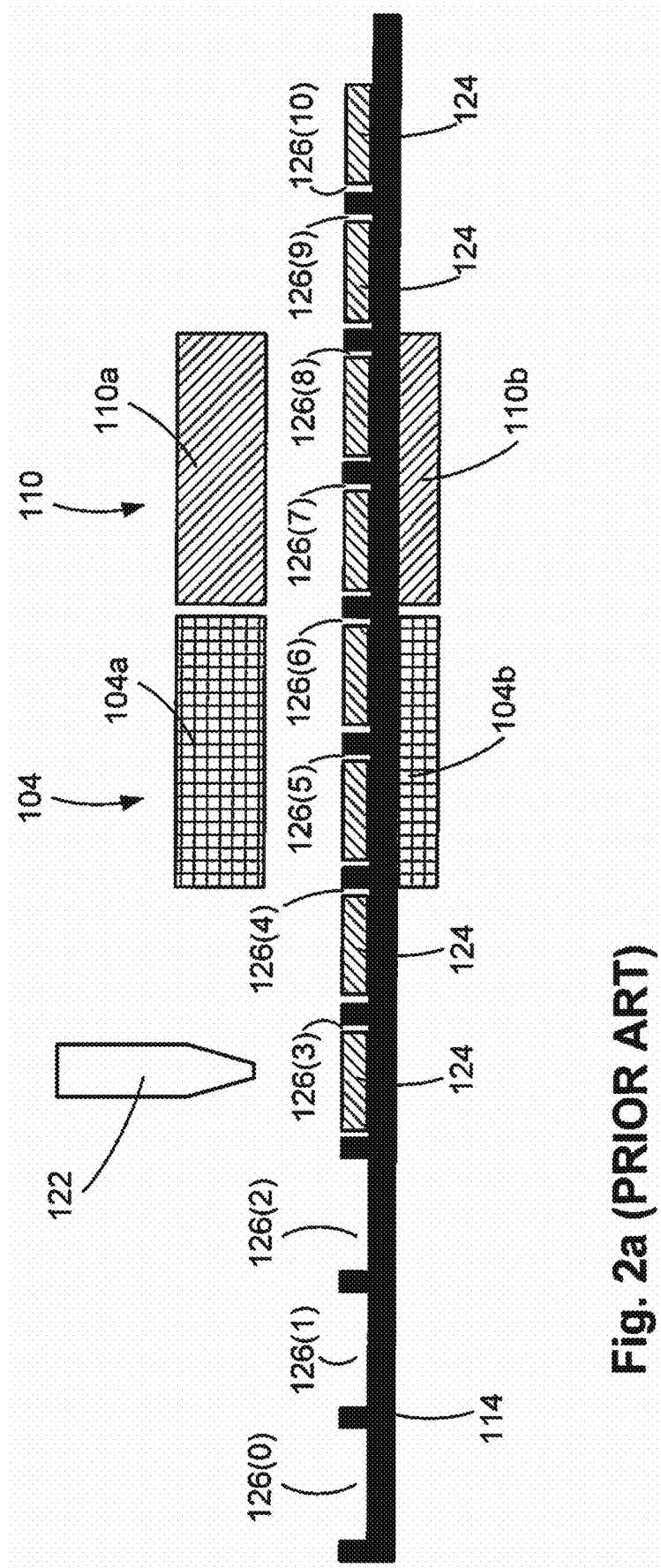
FIGS. 2a to 2o schematically illustrate a known thermocompression and indexing process cycle implemented by the apparatus of FIG. 1.
Figure 2B:
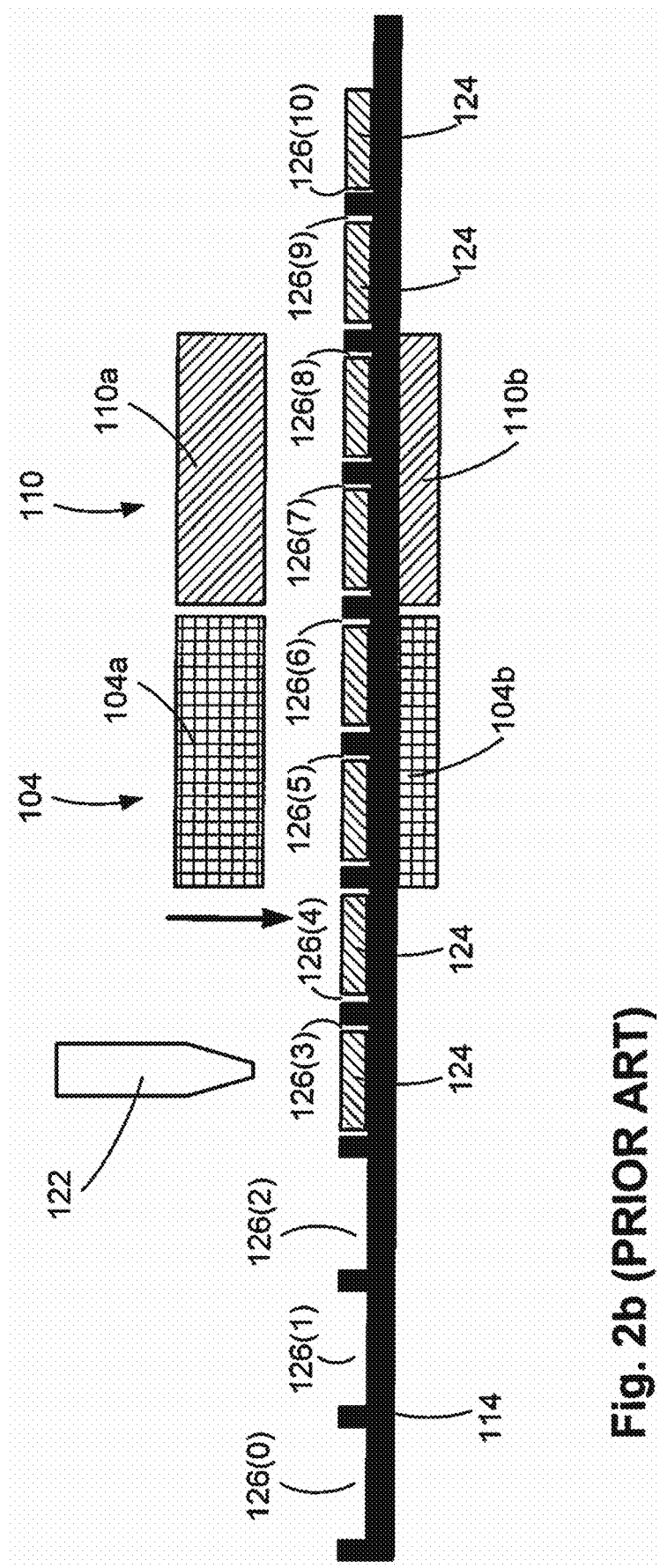
Figure 2C:
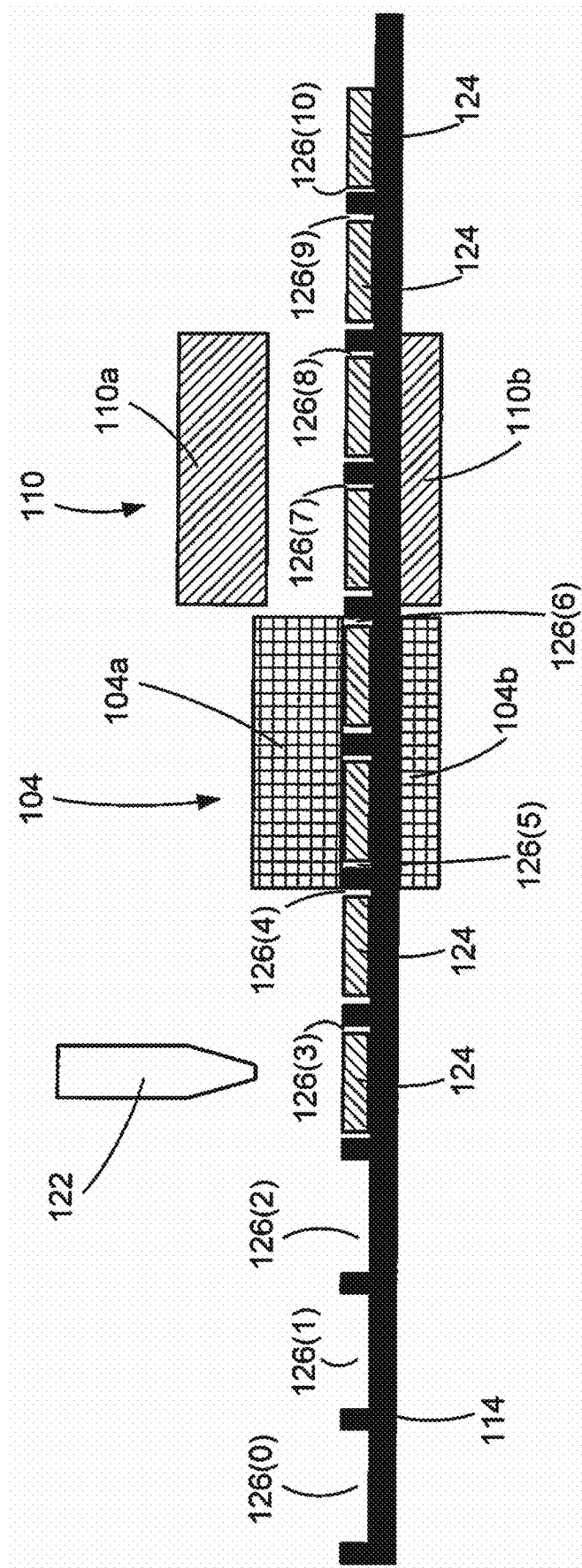
Figure 2D:
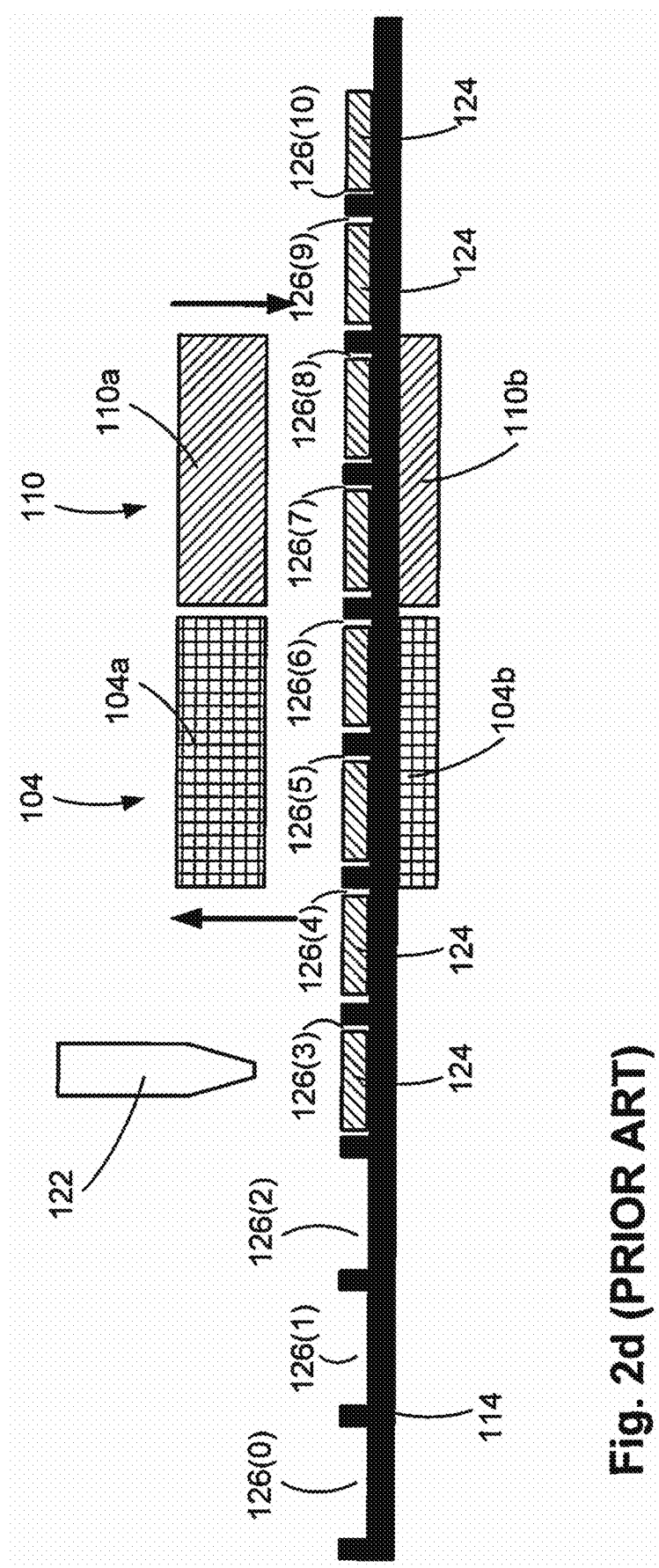
Figure 2E:
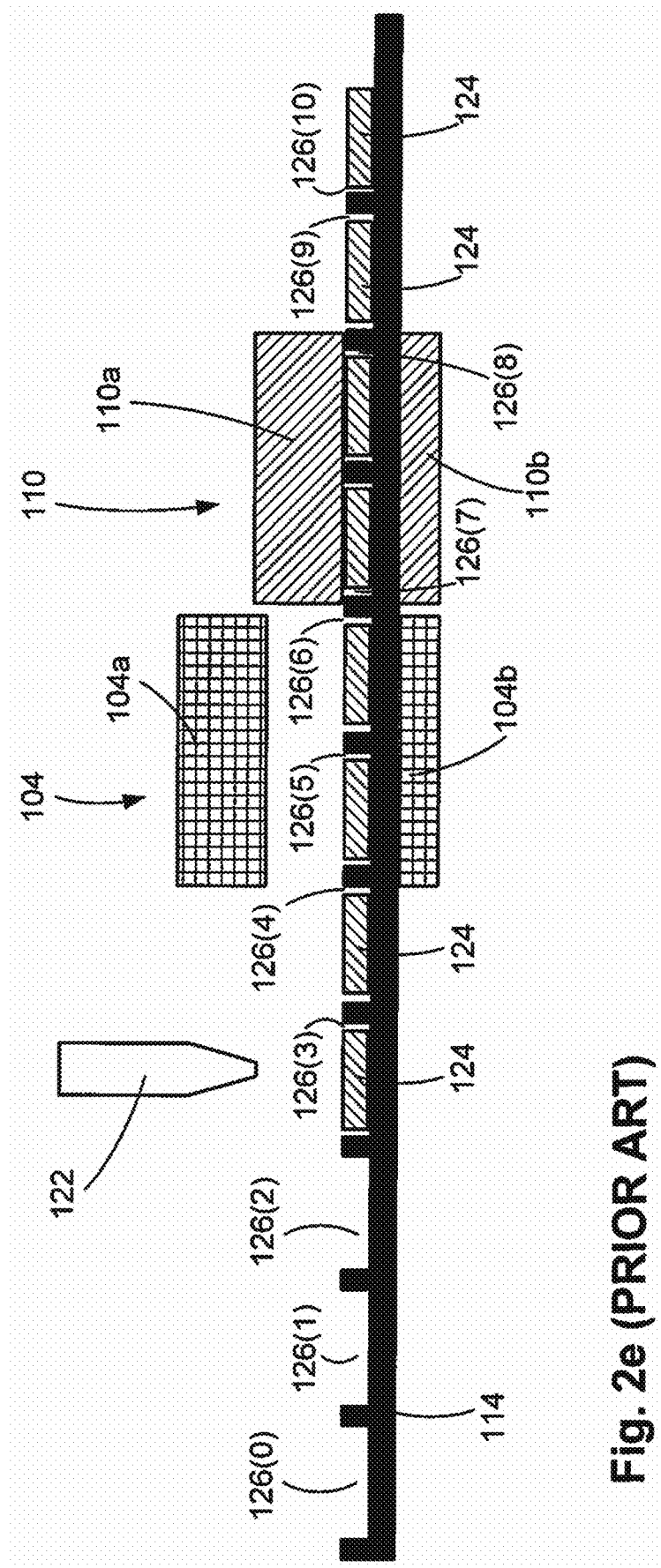
Figure 2F:
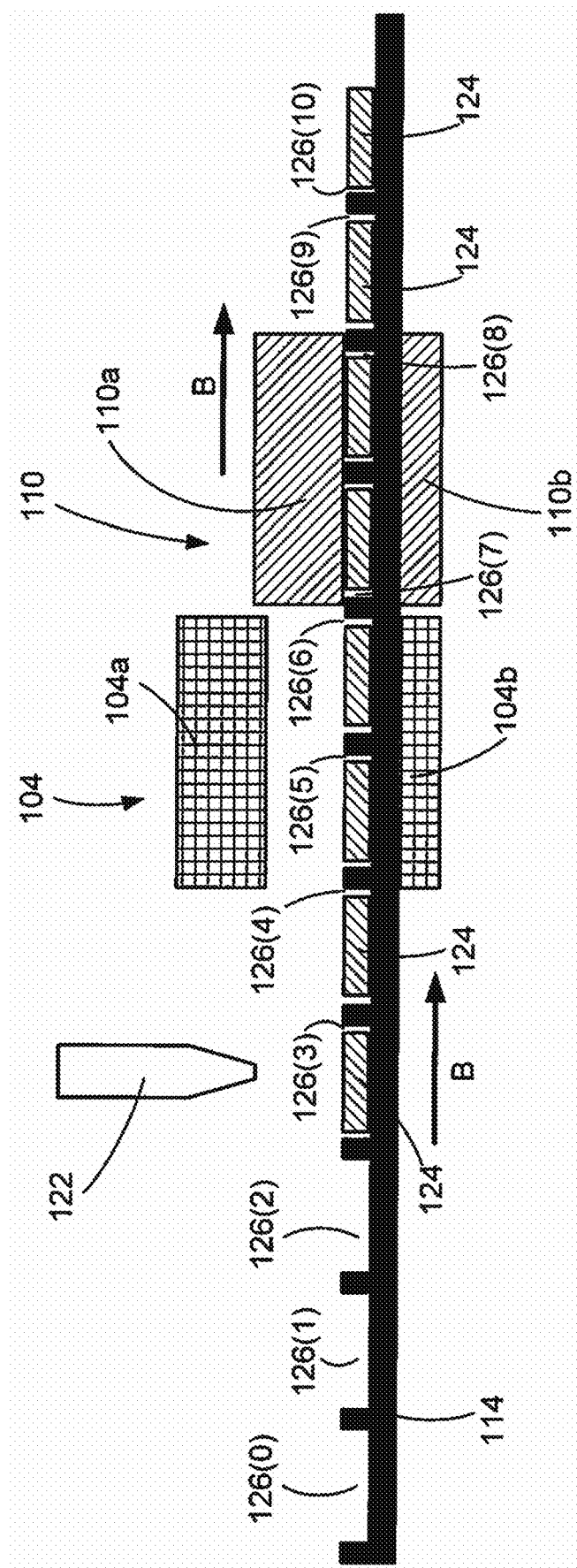
Figure 2G:
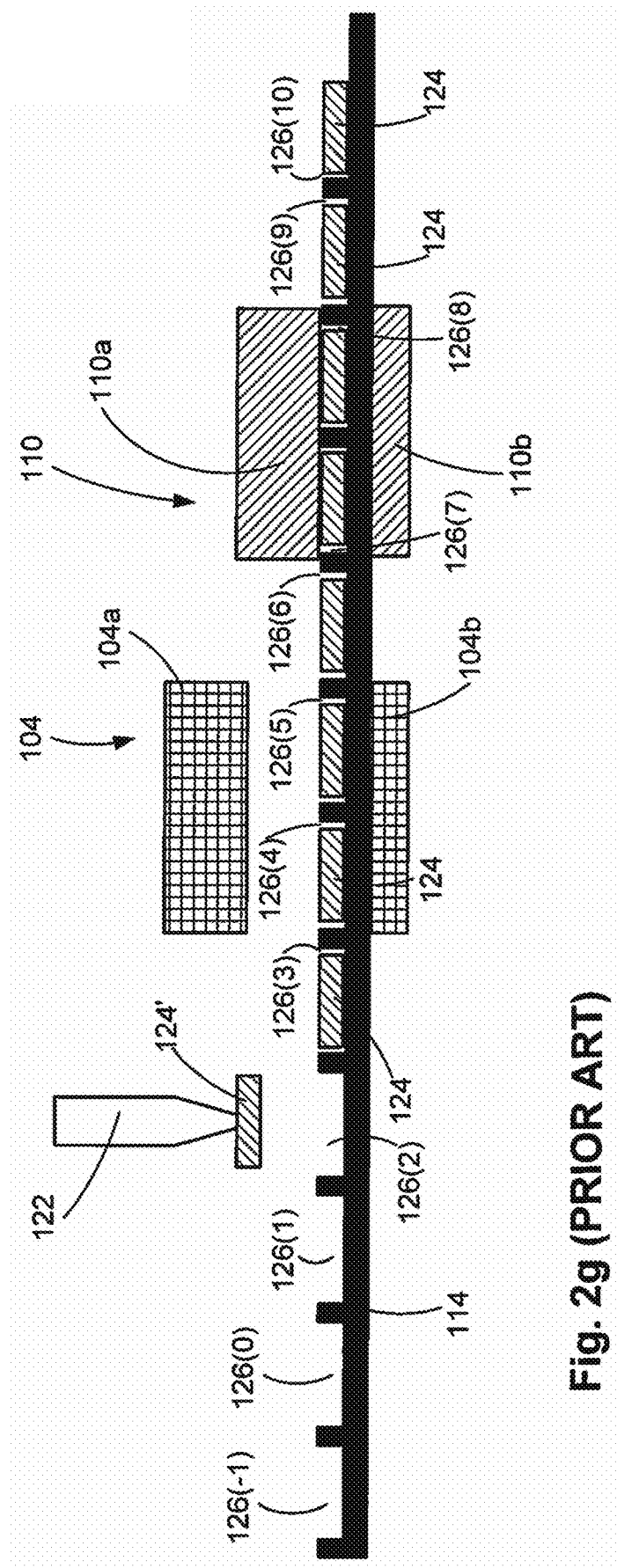
Figure 2H:
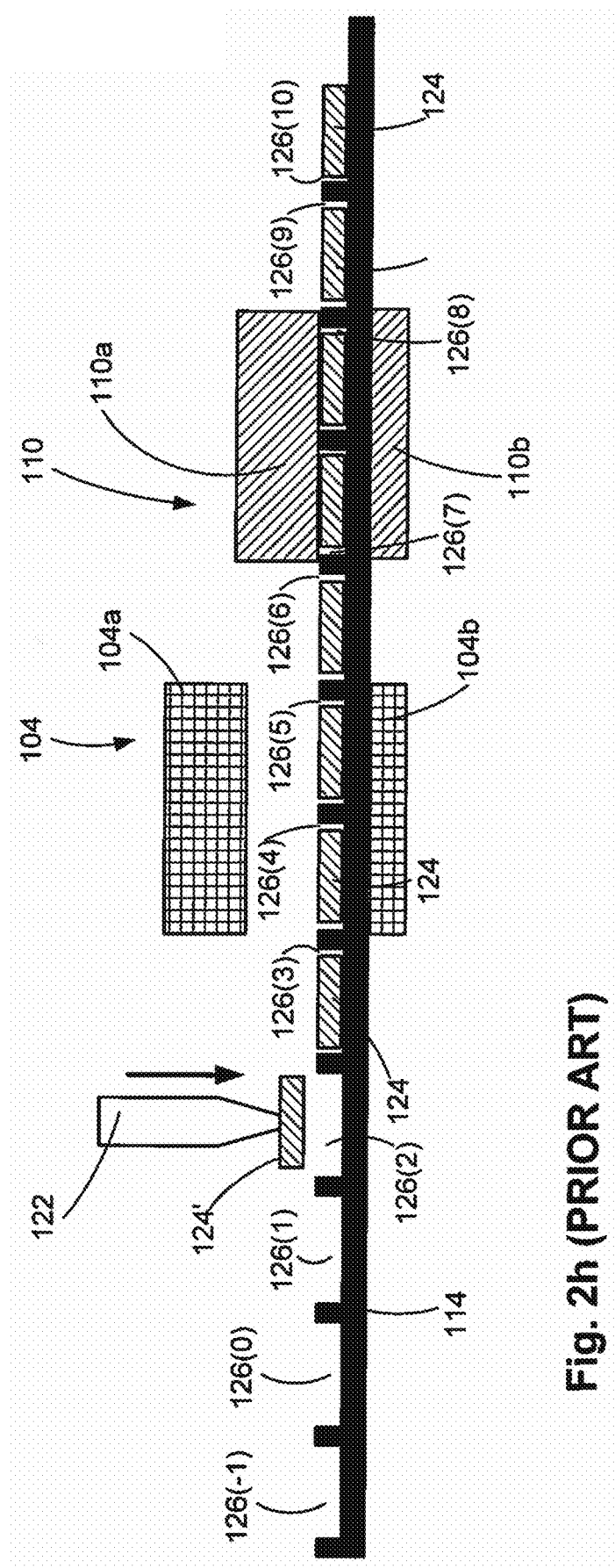
Figure 2J:
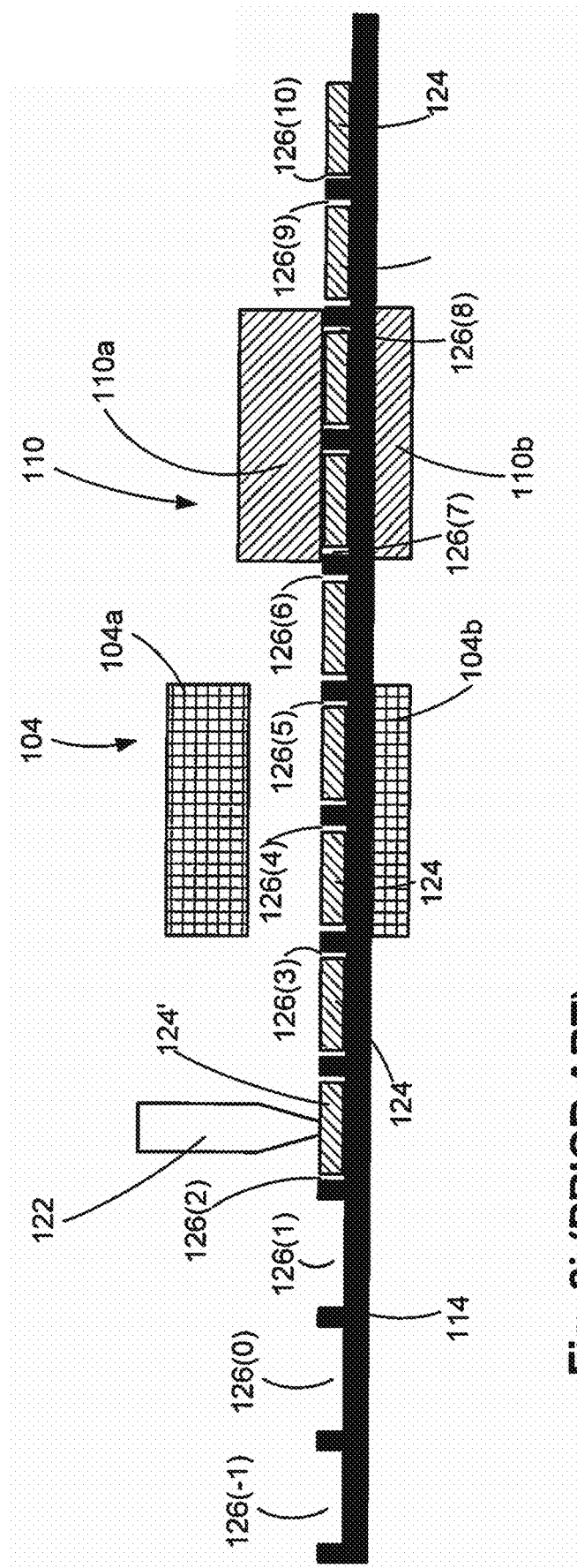
Figure 2K:
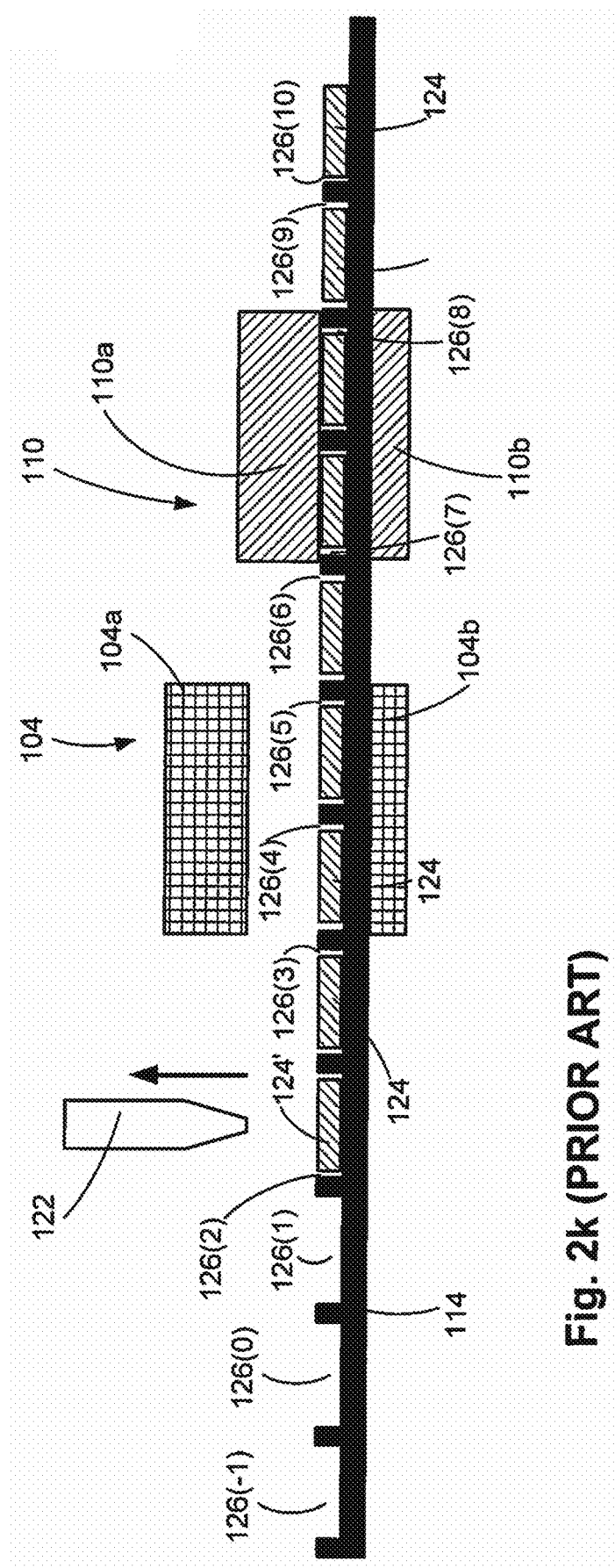
Figure 2I:
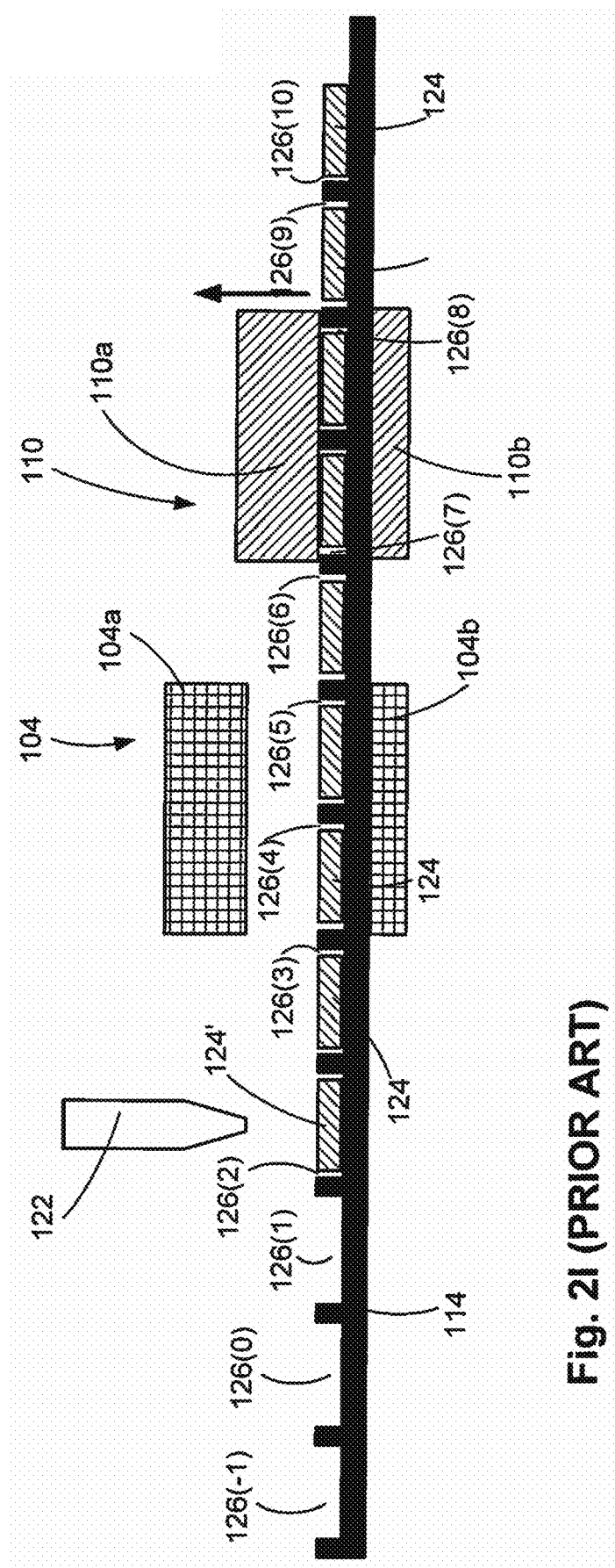
Figure 2M:
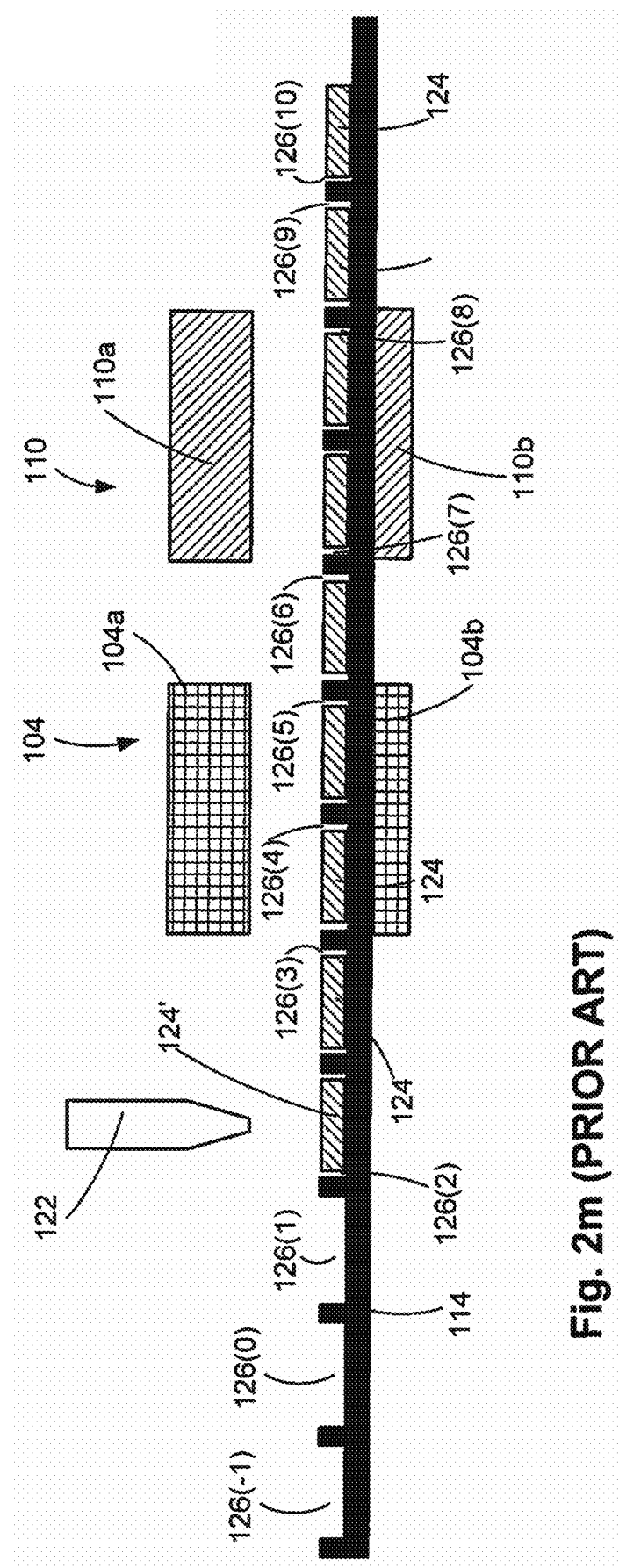
Figure 2N:
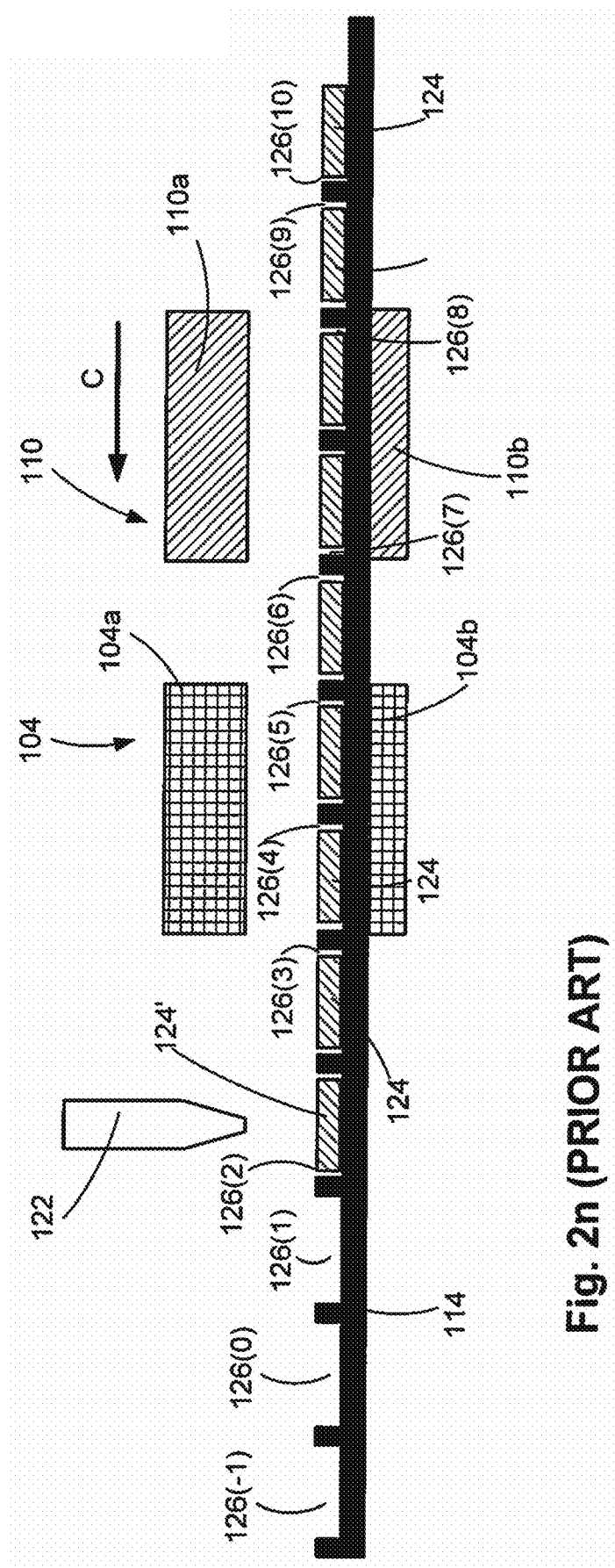
Figure 2O:
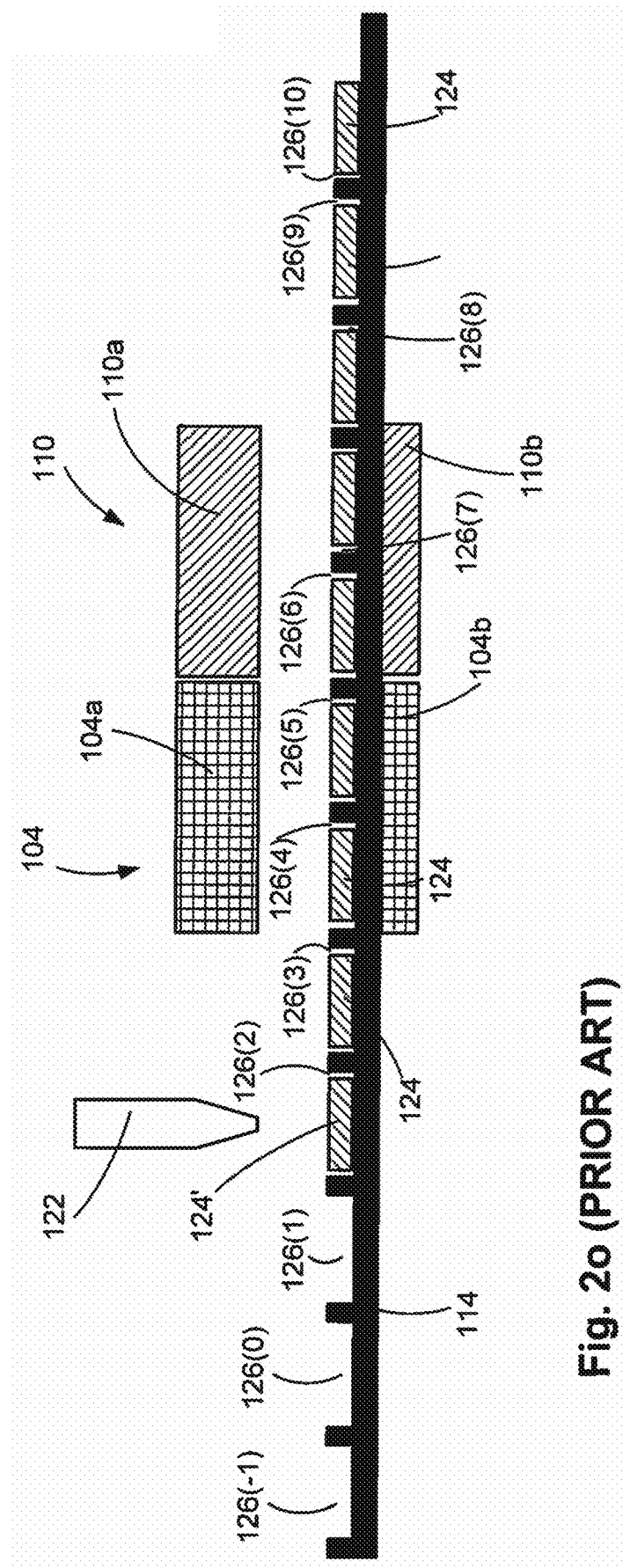
Figure 3:
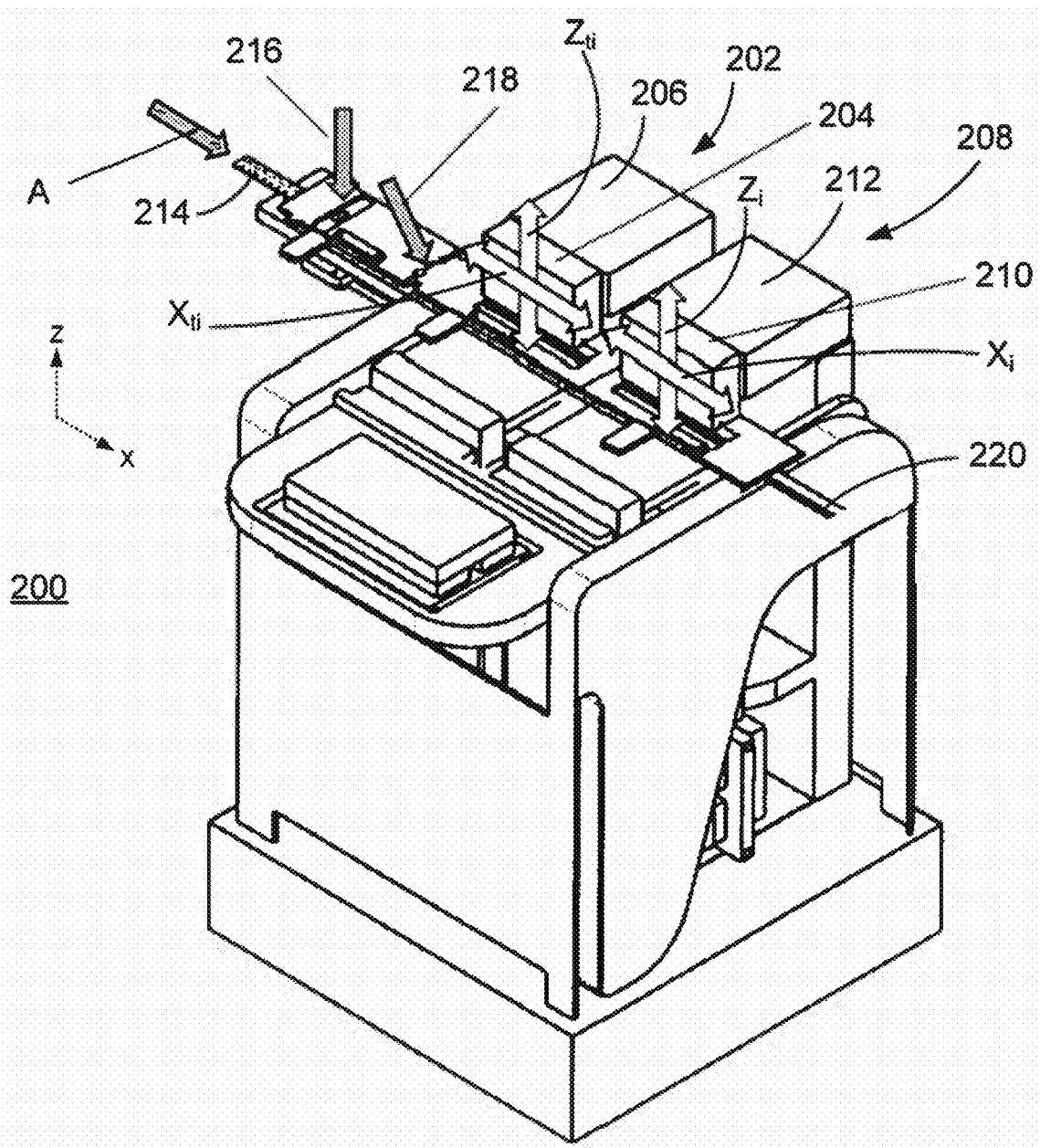
FIG. 3 illustrates a perspective view of a bonding and indexing apparatus according to one or more embodiments of the present invention.

FIG. 3 illustrates a bonding and indexing apparatus (hereinafter, a "thermocompression and indexing apparatus 200") according to one or more embodiments of the present invention.

The thermocompression and indexing apparatus 200 includes a thermocompression and indexing unit 202, which comprises a thermocompression and indexing head 204 and thermocompression and indexing head control circuitry and actuators 206. The thermocompression and indexing apparatus 200 also includes an indexing unit 208, which comprises an indexing head 210 and indexing head control circuitry and actuators 212.

Each of the thermocompression and indexing head 204 and the indexing head 210 comprise a pair of sections (i.e. an upper section and a lower section (not shown)). The upper section of each head is located above a substrate feed channel and the lower section of each head is located below the substrate feed channel. The upper section of each head is moveable towards and away from the lower section of each head in a vertical direction (i.e. along a Z-axis as indicated in the figure). This serves to clamp, or grip, a substrate located in the substrate feed channel between the upper and lower sections of each head.

Movement of the thermocompression and indexing head 204 and the indexing head 210 relative to the substrate feed channel is controlled by way of the thermocompression and indexing head control circuitry and actuators 206 and the indexing head control circuitry and actuators 212 respectively.

A substrate 214 is fed into the substrate feed channel of the apparatus 200 in the direction indicated by arrow A (i.e. in a positive direction along the X-axis). As the substrate 214 is fed through the apparatus along the X-axis, elements can be placed on the substrate 214 at a first insertion or depositing point (indicated by arrow 216 in the figure) by a suitable element insertion or depositing device. Additional elements or material may be fed into the apparatus 200 for placement on the substrate 214 via a second insertion or depositing point (indicated by arrow 218 in the figure).

With all elements and/or materials placed on, in, or against, the substrate 214, the substrate 214 then passes between the upper and lower sections of thermocompression and indexing head 204. Thermocompression and indexing head 204 is operative to perform thermocompression bonding, to the substrate, of the elements and/or materials fed into the apparatus. It achieves this by moving the upper section downwards to press the elements and/or materials against the substrate, which is pressed against the lower section. Heat is applied to the elements and/or materials and the substrate 214 to bond the elements and/or materials to a section of the substrate located between the upper and lower sections of the thermocompression head 204.

In addition to being operative to perform thermocompression bonding, the thermocompression and indexing head 204 is further operative to index, or move, a "bonded" section of the substrate 214 (i.e. as bonded during a thermocompression step performed by the thermocompression and indexing head 204). In the illustrated arrangement, the thermocompression and indexing head 204 indexes, or moves the substrate 214 in the positive direction along the X-axis. This indexes the substrate 214 in the substrate feed channel so that a section that was bonded during the thermocompression step (performed by the thermocompression and indexing head 204) is moved forwards in the substrate feed channel. This causes an unbonded section of the substrate 214 to be "pulled" into a location between where the upper and lower sections of the thermocompression and indexing head 204 will be during the next cycle, i.e. so as to be bonded during the next cycle.

While the thermocompression and indexing head 204 is indexing the substrate 214 in the substrate feed channel, the indexing head 210 returns from an advanced raised position to a start position. This is achieved by operating the indexing head 210 to move in a negative direction along the X-axis. This reverse movement of indexing head 210 returns it to a start position from which point the next step in the process cycle can begin.

Following return of the indexing head 210 from the advanced raised position to the start position, upper section of indexing head 210 then moves downwards to press a "bonded" section of the substrate 214 (that was bonded during a previous processing step) against the lower section of the indexing head 210. When the substrate 214 is gripped by the upper and lower sections of indexing head 210, the thermocompression and indexing head 204 then releases the section of substrate 214 that it is gripping by moving the upper section of the thermocompression and indexing head 204 to an advanced raised position.

Once the upper section of the thermocompression and indexing head 204 has been raised to the advanced raised position, the indexing head 210 then proceeds to advance the substrate 214 in the positive direction along the X-axis. This advances the substrate 214 in the substrate feed channel.

While the indexing head 210 is operated to advance the substrate 214, the thermocompression and indexing head 204 is operated to move from the advanced raised position to a start position, i.e. to return the thermocompression and indexing head 204 to a start position in readiness for the next cycle (in a negative direction along the X-axis).

These opposite movements of the thermocompression and indexing head 204 and indexing head 210, in addition to moving an unbonded section of the substrate 214 into a bonding region of the substrate feed channel, also effect movement of a new section of the substrate 214 into the "feed" end of the substrate feed channel. As before, elements and/or materials can then be added to this new section of the substrate 214. Processed substrate 220 is output from the apparatus 200 at a downstream end thereof.

The thermocompression and indexing head 204 (particularly, the upper section of the thermocompression head 204) has freedom of movement in two directions, i.e. along both the Z-axis (denoted by arrow Zti in FIG. 3) and along the X-axis (denoted by arrow Xti in FIG. 3). The indexing head 210 (particularly, the upper section of the indexing head 210) also has freedom of movement in two directions, i.e. along the Z-axis (to grip the substrate), denoted by arrow Zi in the figure and along the X-axis (to advance the substrate in the substrate feed channel), denoted by arrow Xi in the figure. Optionally, the lower section of the thermocompression head 204 and/or the lower section of the indexing head 210 may move in a Z-direction.

Thus, both heads 204 and 210 are operative to advance the substrate 214 in the substrate feed channel.

Use of the apparatus 200 to implement a thermocompression and indexing process cycle will now be described with reference to FIGS. 4a to 4h. The use will be described by way of example in relation to a process for the population of a transport tape with, for example, electronic components.

Transport tapes may be used for the purpose of transport and delivery of electronic components to an automatic placement machine. The electronic components are enclosed in the transport tape, which can be stored and transported in a rolled-up state. The transport tape comprises a first strip (known as a carrier tape), which comprises preformed tape pockets in which electronic components can be disposed. The tape pockets of the carrier tape are covered with a second strip (known as a cover tape) to retain the electronic components in the tape pockets. The cover tape is bonded to the carrier tape.

In FIGS. 4a to 4h, pertinent features of the apparatus 200 are shown for clarity purposes, namely; the thermocompression and indexing head 204 and the indexing head 210. Also shown is an element pick-up device 222, in particular an electronic component pick-up device. There is also shown a substrate 214, which comprises a carrier tape. The element pick-up device 222, for example a vacuum pipette, is used to pick-up electronic components 224 from a storage location and move them to a position above the substrate 214 (hereinafter carrier tape 214) from where the electronic components can be placed in tape pockets 226(0) to 226(10) of carrier tape 214.

For convenience and clarity purposes a cover tape portion of the transport tape is not shown in FIGS. 4a to 4h.

Figure 4A:
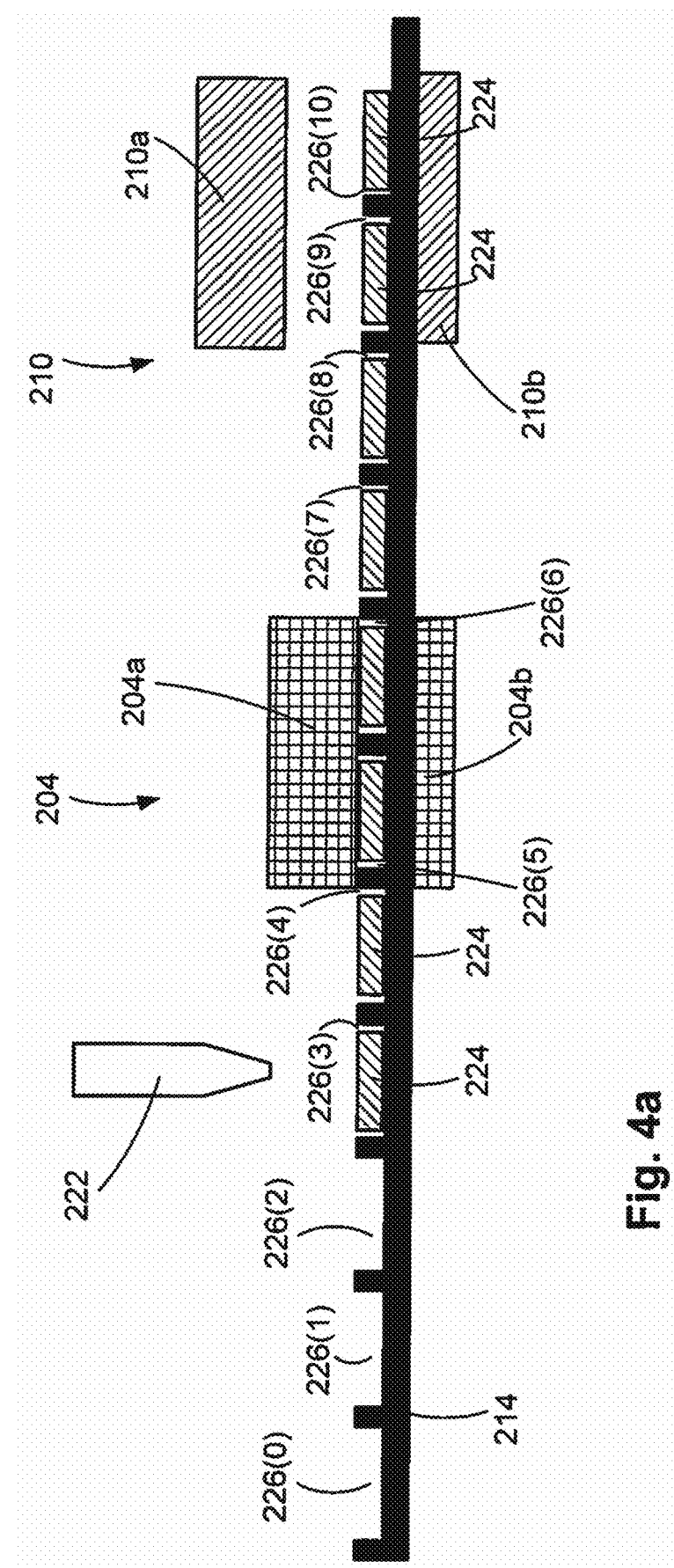

As can be seen, the carrier tape 214 is shown in a partially populated state in FIG. 4a. That is, tape pockets 226(3) to 226(10) already contain electronic components 224, while tape pockets 226(0), 226(1) and 226(2) are empty.

The thermocompression and indexing head 204 comprises an upper section 204a and a lower section 204b. The indexing head 210 comprises an upper section 210a and a lower section 210b. The heads and their respective upper and lower sections have been described above in relation to FIG. 3.

In FIG. 4a, the upper section 204a of the thermocompression and indexing head 204 is in a lowered position with a portion of the substrate 214 gripped between the upper section 204a and the lower section 204b. The indexing head 210 is in an advanced position (having previously carried out an indexing step) and the upper section 210a of the indexing head 210 is in an advanced raised position.

With the thermocompression and indexing head 204 in the lowered position, the upper section 204a presses the cover tape (not shown) against a portion of the carrier tape 214. The portion of the carrier tape 214 at tape pockets 226(5) and 226(6) is pressed against lower section 204b of head 204.

From the position illustrated in FIG. 4a, the thermocompression and indexing head 204 is moved in a direction indicated by arrow D (see FIG. 4b), i.e. corresponding to movement in a positive direction along the X-axis of FIG. 3. As a consequence of this, the carrier tape 214 and cover tape are also moved in the same direction. The carrier tape 214 and cover tape are advanced by one tape pocket pitch, i.e. so that each tape pocket has moved (to the right of the page in the figure) by one tape pocket pitch. Therefore, a new tape pocket (tape pocket 226(−1) enters the substrate feed channel from the substrate input feed.

The thermocompression and indexing head 204, at the same time as performing indexing of the carrier tape 214 and cover tape, is also actuated to apply heat to the portion of the cover tape and carrier tape 214 located in the bonding section (i.e. between the upper and lower sections of the head 204). By way of thermocompression, i.e. the application of pressure and heat, the portions of cover tape and carrier tape 214 between the upper and lower sections of head 204 are bonded together to sealably contain the electronic components 224 in the tape pockets 226(5) and 226(6). Those electronic components 224 in tape pockets 226(7) to 226(10) were sealably contained between bonded sections of cover tape and carrier tape 214 during earlier steps in the process cycle.

Figure 4B:
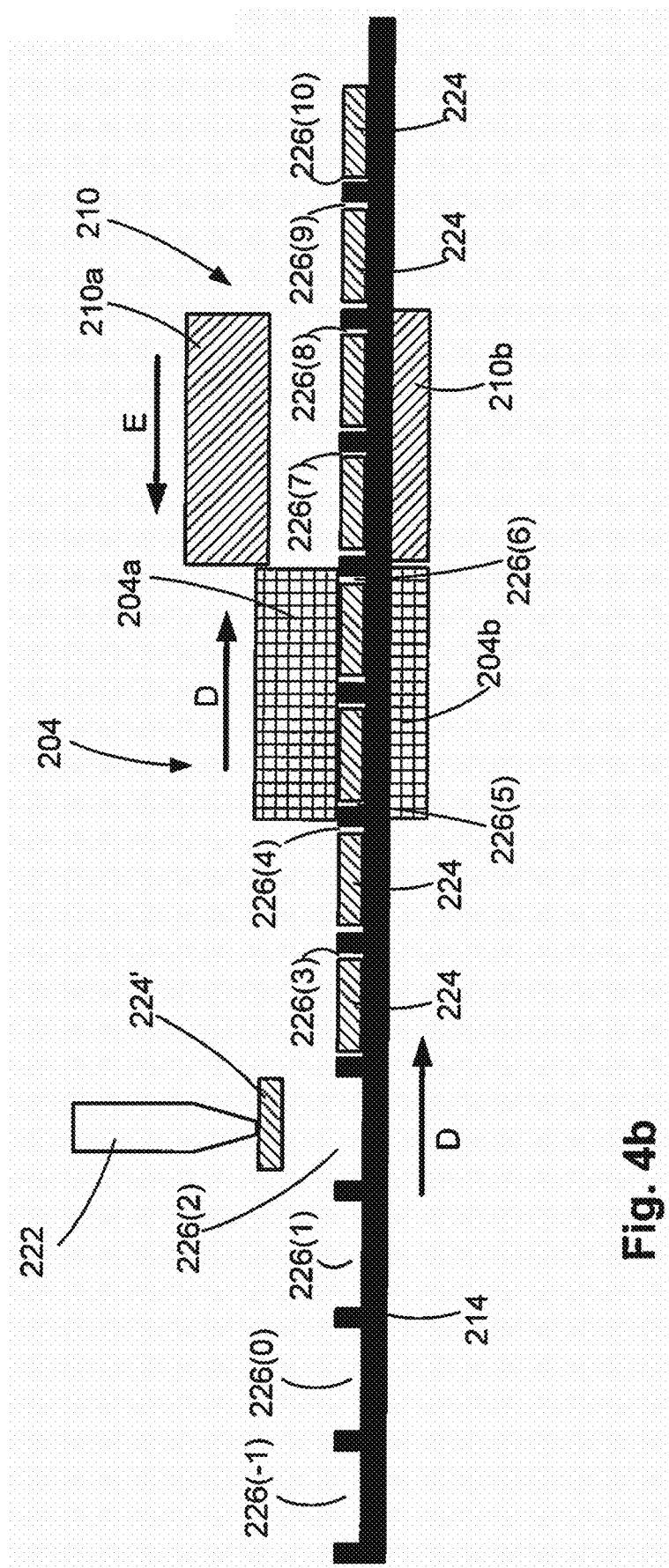
Figure 4C:
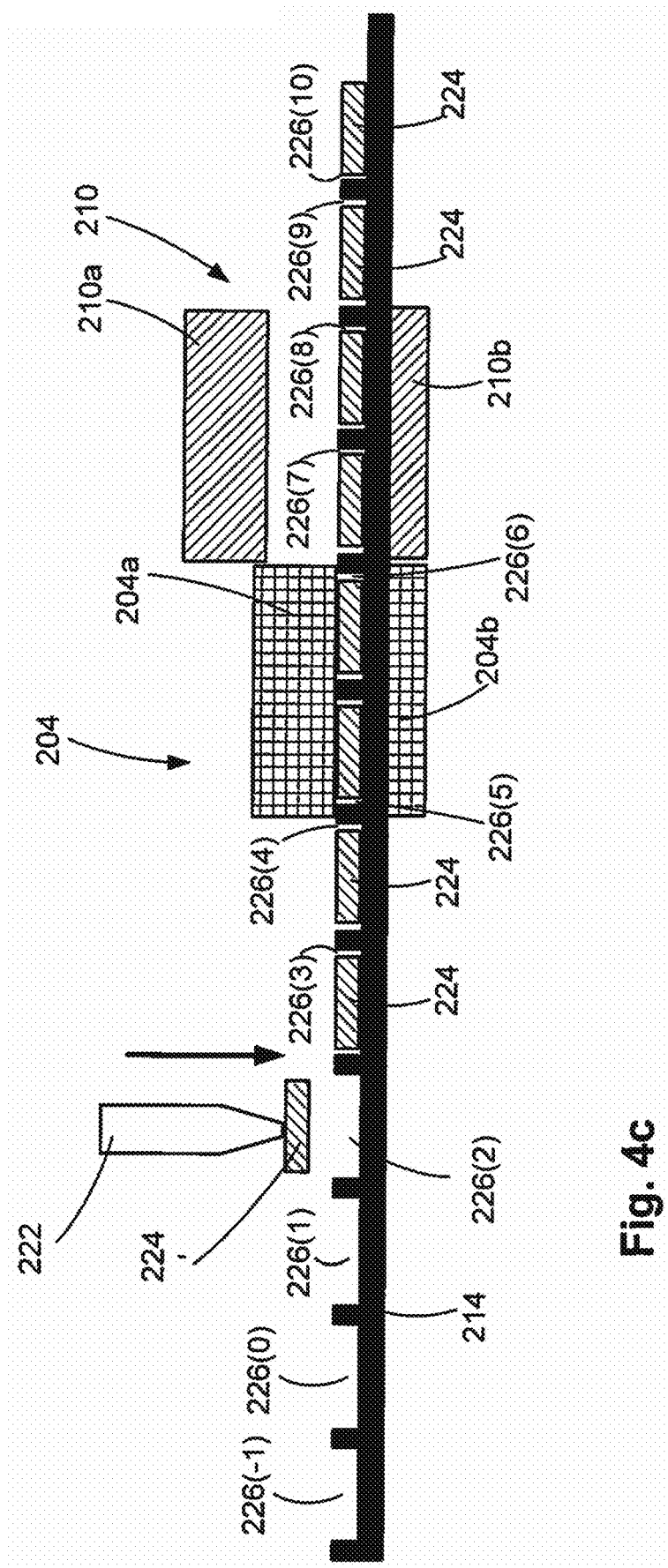
Figure 4D:
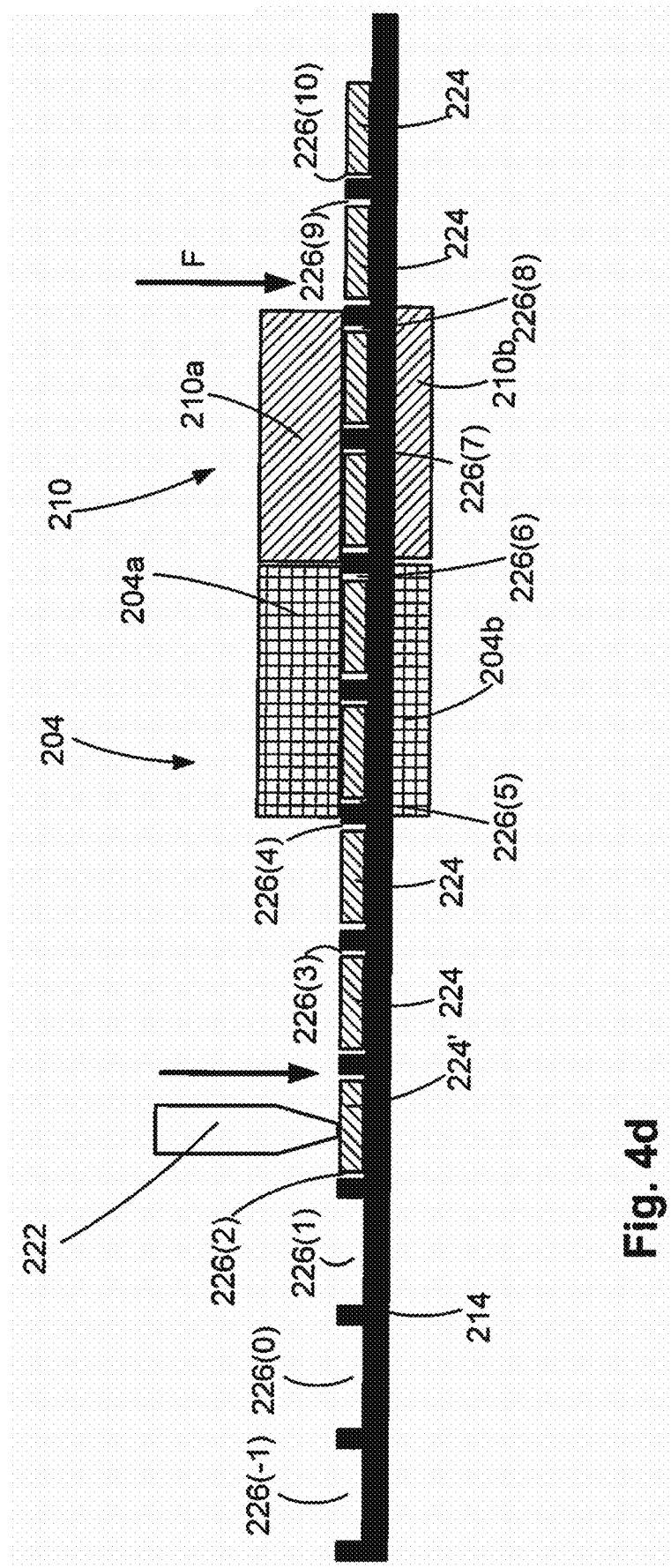

While the thermocompression and indexing step is being performed by the thermocompression and indexing head 204, indexing head 210, which is in the advanced position, is moved in a direction indicated by arrow E in FIG. 4b (i.e. in a negative direction along the X-axis). This reverse movement of indexing head 210 returns it to a start position (see FIG. 4c).

When the indexing head 210 has reached its start position (FIG. 4c), the element pick-up device 222 brings a new electronic component 224' to a location above empty tape pocket 226(2) of the carrier tape 214. The element pick-up device 222 is lowered to lower electronic component 224' towards empty tape pocket 226(2) (see FIGS. 4c and 4d) until the electronic component 224' is located in tape pocket 226(2).

While the element pick-up device 222 is lowering electronic component 224' into empty tape pocket 226(2), the upper section 210a of indexing head 210 is moved downwards (in a direction indicated by arrow F—see FIG. 4d) from its start position to a lowered position. In the lowered position (see FIG. 4d), the upper section 210a presses a portion of cover tape and carrier tape 214 (previously bonded about tape pockets 226(7) and 226(8)) against lower section 210b.

Figure 4E:
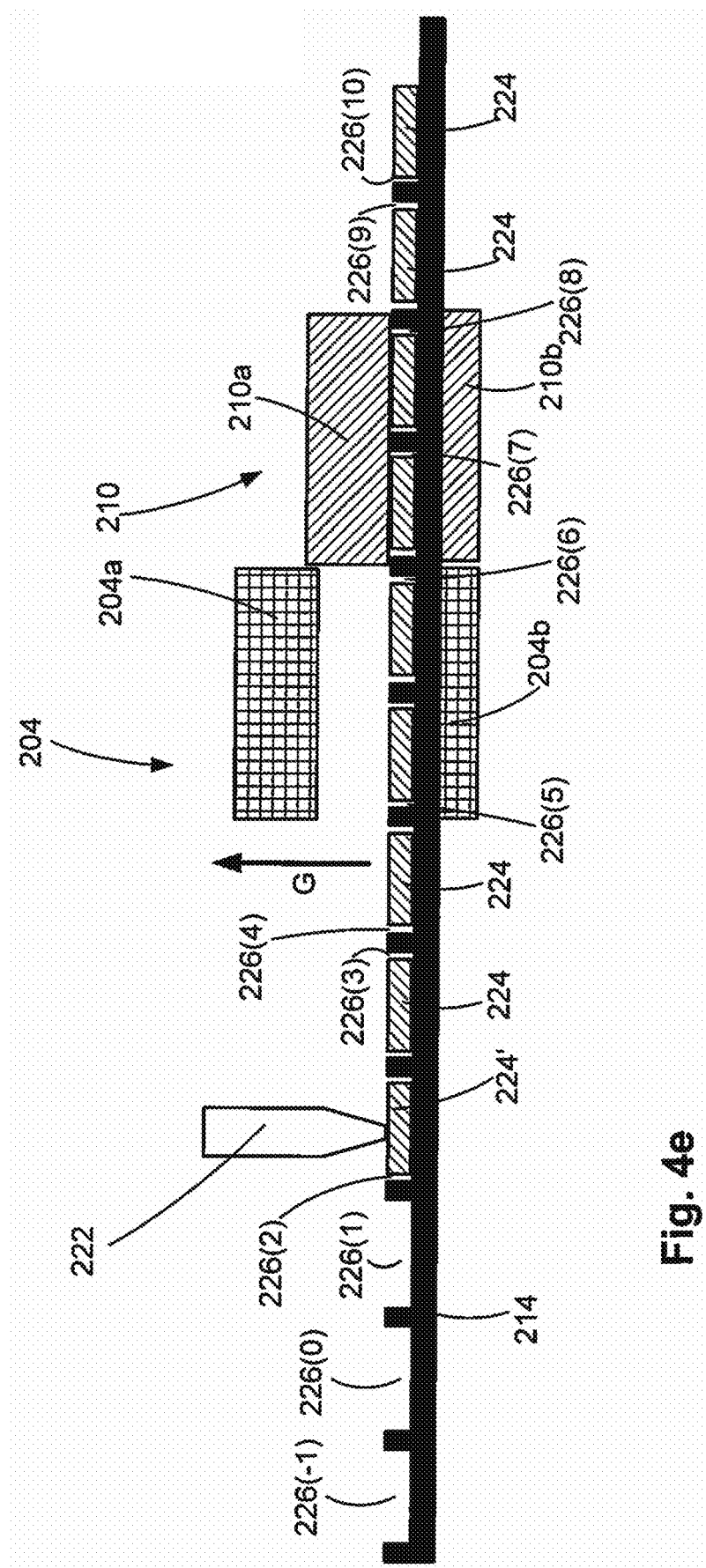
Figure 4F:
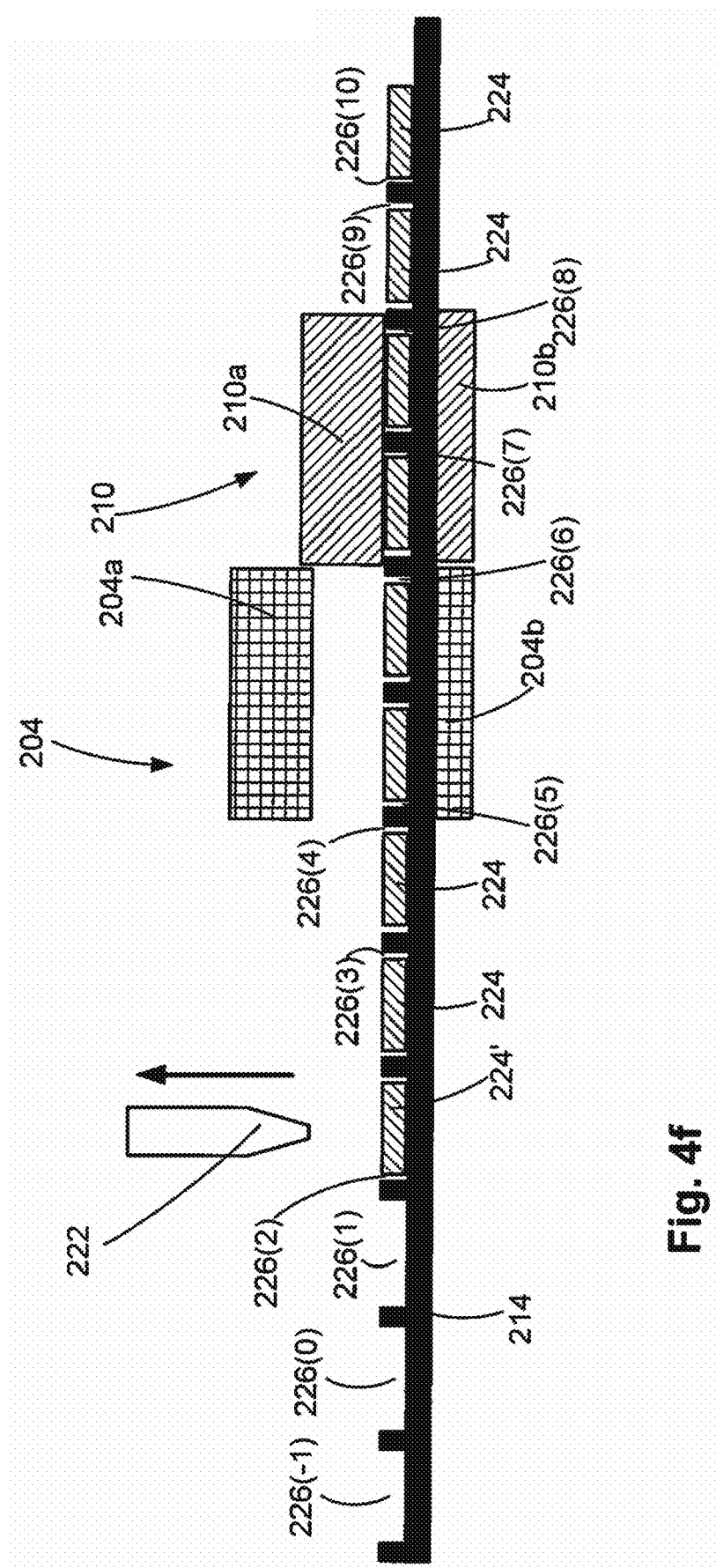

Following lowering of the indexing head 210, the upper section 204a of head 204 is moved upward (in a direction indicated by arrow G) from a lowered position to a raised advanced position (see FIG. 4e).

The element pick-up device 222 is then operated to release the electronic component 224' so that the electronic component 224' remains in tape pocket 226(2). The element pick-up device is raised to a raised position (see FIG. 4f), and then subsequently moved to a remote location (see FIG. 4g) to enable inspection of the electronic component 224' (e.g. by way of an inspection device 228—see FIG. 4g).

Figure 4G:
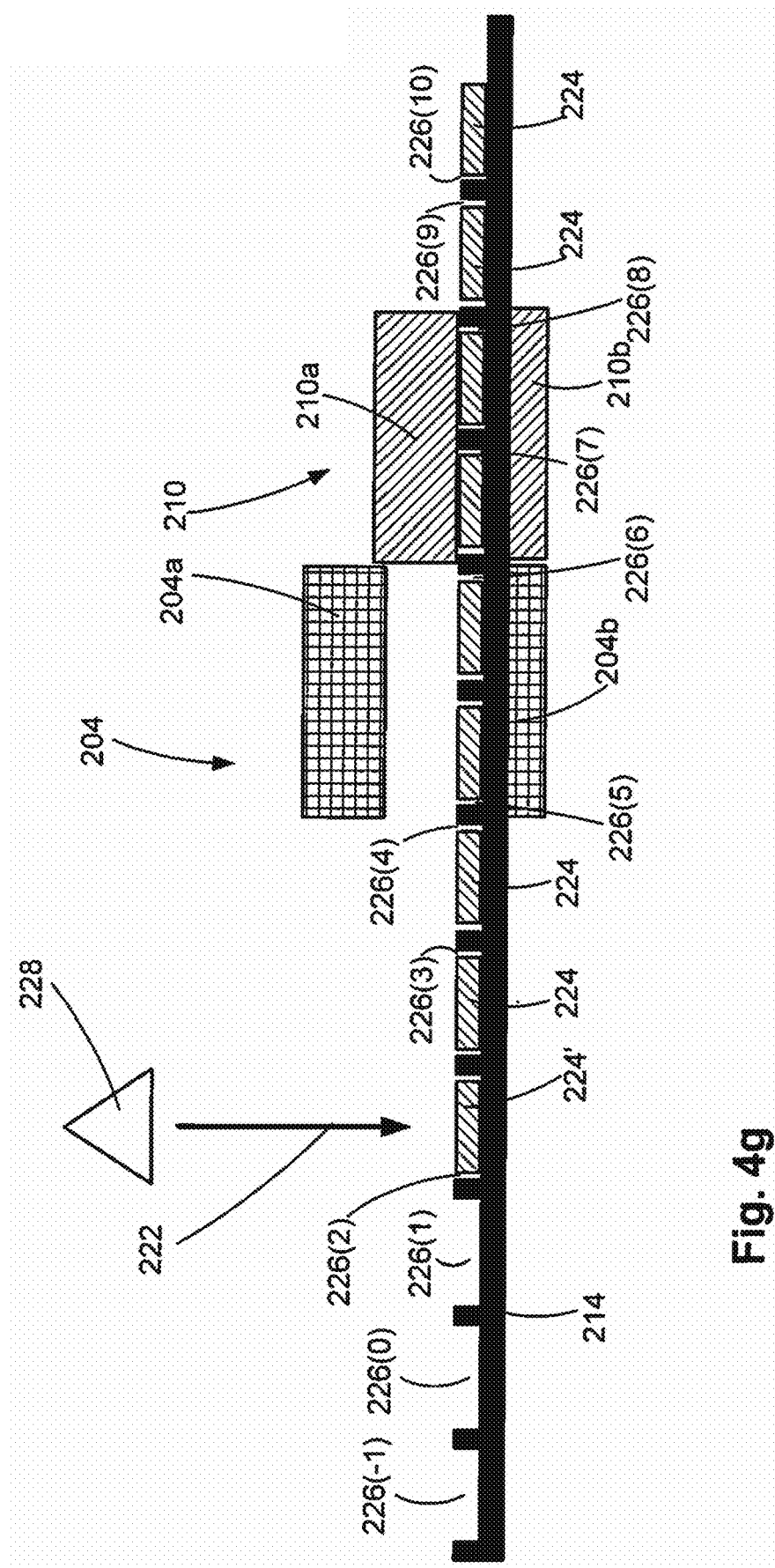
Figure 4H:
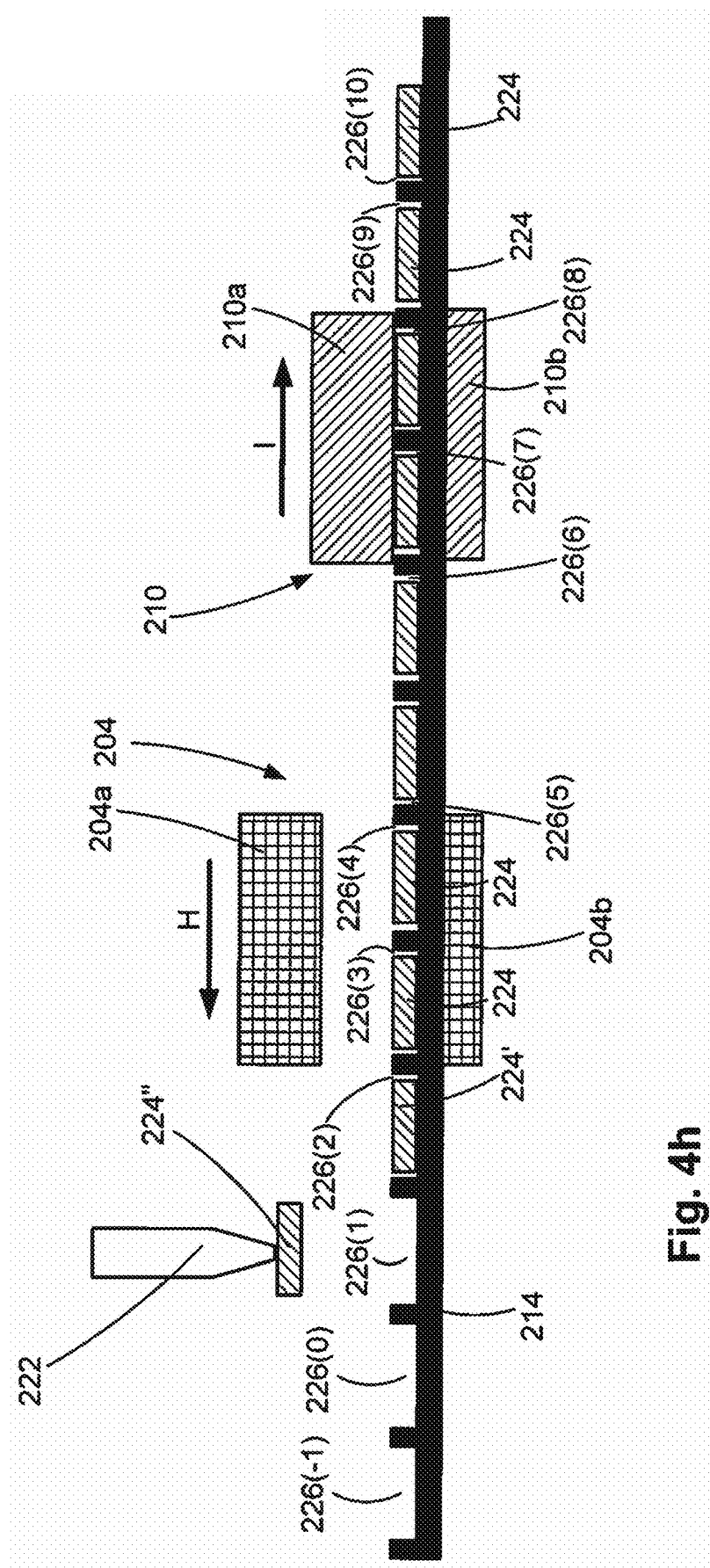

From the position indicated in FIG. 4g, the thermocompression and indexing head 204 (i.e. in the advanced position illustrated in FIG. 4g), is moved in a direction indicated by arrow H in FIG. 4h (i.e. in a negative direction along the X-axis). This reverse movement of thermocompression and indexing head 204 returns it to a start position.

The element pick-up device 222 brings a new electronic component 224" to a location above empty tape pocket 226(1) of the carrier tape 214.

Inspection of an electronic component may be an optional step in the process and may be omitted in one or more embodiments.

While the thermocompression and indexing head 204 is being returned to its start position from the advanced position, the indexing head 210 is moved in a direction indicated by arrow I (see FIG. 4h) from its start position to an advanced position, i.e. corresponding to movement in a positive direction along the X-axis of FIG. 3. As a consequence of this, the carrier tape 214 and cover tape are also moved in the same direction. The carrier tape 214 and cover tape are advanced by one tape pocket pitch, i.e. so that each tape pocket has moved (to the right of the page in the figure) by one tape pocket pitch. Therefore, a new tape pocket enters the substrate feed channel from the substrate input feed.

Also while the thermocompression and indexing head 204 and indexing head 210 are being moved, the element pick-up device 222 brings a new electronic component 224" to a location (i.e. a start position) above empty tape pocket 226(1) of the carrier tape 214.

From the position indicated in FIG. 4h, the thermocompression and indexing head 204 (i.e. in the raised position illustrated in FIG. 4h), is moved in a direction indicated by arrow J in FIG. 4i from its start position to a lowered position.

In FIG. 4i, the upper section 204a of the thermocompression and indexing head 204 is in a lowered position with a portion of the substrate 214 gripped between the upper section 204a and the lower section 204b. The indexing head 210 is in an advanced position (having previously carried out an indexing step—see FIG. 4h) and the upper section 210a of the indexing head 210 is in an advanced lowered position.

Figure 4J:
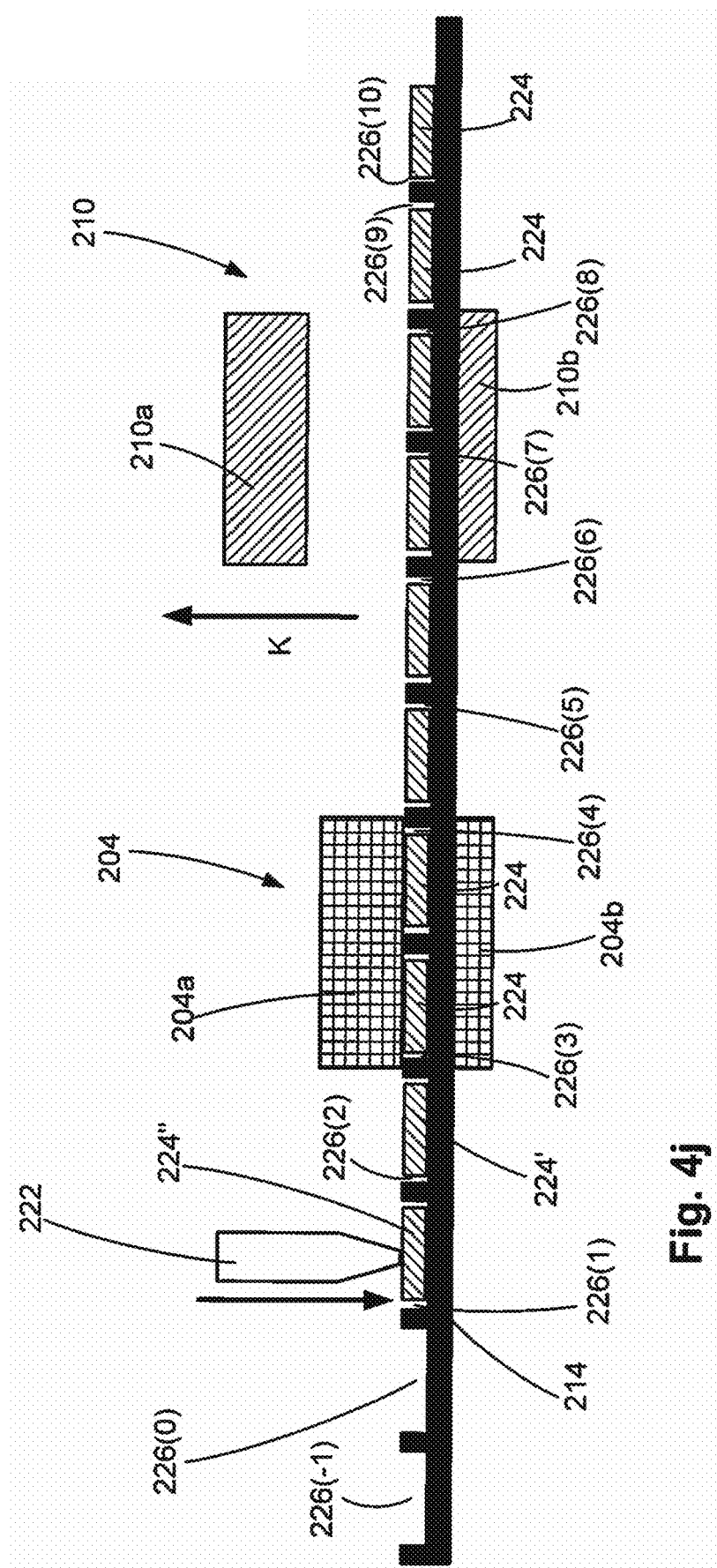

From the position indicated in FIG. 4i, the indexing head 210 (i.e. in the advanced lowered position illustrated in FIG. 4i), is moved in a direction indicated by arrow K in FIG. 4j from the advanced lowered position to the advanced raised position.

The element pick-up device 222 is lowered to lower electronic component 224" towards empty tape pocket 226(1) (see FIG. 4j) until the electronic component 224" is located in tape pocket 226(2).

Once the steps illustrated in FIG. 4j are complete, the cycle is complete and the process returns to that illustrated in FIG. 4a.

It will be appreciated that thermocompression takes place once per two indexes in the apparatus of one or more embodiments of the present invention.

The apparatus 200 of one or more embodiments of the present invention comprises two indexing heads, i.e. the thermocompression and indexing head 204 and the indexing head 210. Each head 204, 210 can grip the substrate and move it in the length direction of the substrate (i.e. move the substrate in a substrate feed direction along the X-axis of the apparatus). As is discussed in the "Background" section above in relation to the known apparatus, reverse movement of an indexing head (i.e. to return the indexing head from an advanced position to a start position) can create a delay time in a process cycle of the apparatus. This may be mitigated by one or more embodiments of the present invention, because two indexing heads are provided instead of one. While a first indexing head is indexing, or advancing, the substrate, a second indexing head is reversing (i.e. returning to a start position from an advance position). When the second indexing head is indexing the substrate, the first indexing head is reversing. In this way, there may be no delays in the apparatus process cycle and so apparatus output may be increased.

The movements of the thermocompression and indexing head 204 and indexing head 210 along the X-axis are balanced. That is, when the thermocompression and indexing head 204 is indexing, the indexing head 210 is reversing (see FIG. 4b), and when the thermocompression and indexing head 204 is reversing, the indexing head 210 is indexing (see FIG. 4h). This may reduce linear and rotational forces imparted to the apparatus during movement of the heads 204, 210, because their movements in opposite directions in the X-direction may balance each other. This may serve to reduce vibrations experienced by the apparatus and may serve to improve the position accuracy of the substrate in the substrate in the substrate feed channel.

Although a bonding and indexing apparatus according to one or more embodiments of the present invention has been described in relation to an apparatus that comprises grippers for performing indexing steps, optionally a pin, or pins, that is/are moveable may be used to perform indexing. Further optionally, indexing may be performed by a so-called sprocket-wheel. Regardless of the type of indexing element used to perform indexing, in the apparatus according to one or more embodiments of the present invention, thermocompression and movement in the indexing direction can be performed simultaneously.

Although one or more embodiments of the present invention are described in relation to a thermocompression and indexing apparatus as the bonding and indexing apparatus, optionally, the bonding and indexing apparatus may comprise an apparatus operative to perform other types of bonding steps, e.g. ultrasonic bonding.

Although one or more embodiments of the present invention are described in relation to an apparatus for populating a transport tape with electronic components, it is envisaged that further embodiments of the present invention could be employed in other thermocompression processes in semiconductor assembly equipment. For example, soldering, curing glue in semiconductor interconnections, or assembly equipment of all IC and discrete semiconductor devices. In such examples, the substrate may be a circuit board and the element for disposal on the substrate may be an IC or discrete semiconductor device.

Particular and preferred aspects of the invention are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed invention or mitigate against any or all of the problems addressed by the present invention. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

Term "comprising" does not exclude other elements or steps, the term "a" or "an" does not exclude a plurality. Reference signs in the claims shall not be construed as limiting the scope of the claims.

What is claimed is:

1. A bonding and indexing apparatus, comprising:
a first index head configured to move a substrate in an indexing direction from a first position to a second position;
a second index head configured to move the substrate in an indexing direction from the second position to a third position;
wherein at least one of the first index head and the second index head further comprises a bonding element configured to effect a bonding process between the substrate and an element disposed against the substrate so that bonding and movement in the indexing direction is implemented simultaneously by any index head selected from the group consisting of the first index head, the second index head, and any combination thereof.

2. The apparatus according to claim 1, wherein the first index head is configured to move from a first index start position to engage with the substrate.

3. The apparatus according to claim 2, wherein the first index head is configured to return to the first index start position upon reaching the second position.

4. The apparatus according to claim 2, wherein the first index head is configured to maintain engagement with the substrate during movement in the indexing direction.

5. The apparatus according to claim 4, wherein the first index head is configured to release the substrate from engagement upon reaching the second position.

6. The apparatus according to claim 5, wherein the first index head is configured to return to the first index start position upon reaching the second position.

7. The apparatus according to claim 6, wherein the second index head is configured to move from a second index start position to engage with the substrate.

8. The apparatus according to claim 7, wherein the second index head is configured to maintain engagement with the substrate during movement in the indexing direction.

9. The apparatus according to claim 8, wherein the second index head is configured to release the substrate from engagement upon reaching the third position.

10. The apparatus according to claim 9, wherein the second index head is configured to return to the second index start position upon reaching the third position.

11. The apparatus according to claim 1, wherein the first index head is configured to maintain engagement with the substrate during movement in the indexing direction.

12. The apparatus according to claim 2, wherein the first index head is configured to release the substrate from engagement upon reaching the second position.

13. The apparatus according to claim 1, wherein the second index head is configured to move from a second index start position to engage with the substrate.

14. The apparatus according to claim 13, wherein the second index head is configured to return to the second index start position upon reaching the third position.

15. The apparatus according to claim 1, wherein the second index head is configured to maintain engagement with the substrate during movement in the indexing direction.

16. The apparatus according to claim 1, wherein the second index head is configured to release the substrate from engagement upon reaching the third position.

17. The apparatus according to claim 1, wherein the bonding element further comprises a thermocompression element configured to apply a thermocompressive force to the substrate and to the element disposed against the substrate so that thermocompression and movement in the indexing direction is implemented simultaneously by the group consisting of the first index head, the second index head, and any combination thereof.

18. The apparatus according to claim 1, wherein the first index head and/or the second index head further comprise a linear moving mechanism to effect movement of said substrate.

19. The apparatus according to claim 1, wherein the first index head and/or the second index head comprises a rotary moving mechanism to effect movement of the substrate.

20. The apparatus according to claim 1, wherein the first index head and/or the second index head is configured to grip the substrate during indexing movement.

* * * * *